United States Patent
Yokoyama et al.

(10) Patent No.: US 8,883,397 B2
(45) Date of Patent: Nov. 11, 2014

(54) POSITIVE PHOTOSENSITIVE SILOXANE COMPOSITION

(75) Inventors: Daishi Yokoyama, Kakegawa (JP); Takashi Fuke, Kakegawa (JP); Yuji Tashiro, Kakegawa (JP); Takashi Sekito, Kakegawa (JP); Toshiaki Nonaka, Kakegawa (JP)

(73) Assignee: AZ Electronic Materials USA Corp., Somerville, NJ (US)

( * ) Notice: Subject to any disclaimer, the term of this patent is extended or adjusted under 35 U.S.C. 154(b) by 84 days.

(21) Appl. No.: 13/814,686

(22) PCT Filed: Aug. 19, 2011

(86) PCT No.: PCT/JP2011/068751
§ 371 (c)(1),
(2), (4) Date: Apr. 12, 2013

(87) PCT Pub. No.: WO2012/026400
PCT Pub. Date: Mar. 1, 2012

(65) Prior Publication Data
US 2013/0216952 A1 Aug. 22, 2013

(30) Foreign Application Priority Data

Aug. 24, 2010 (JP) ................. 2010-186986

(51) Int. Cl.
*G03F 7/075* (2006.01)
*G03F 7/039* (2006.01)
*G03F 7/022* (2006.01)

(52) U.S. Cl.
USPC .......... 430/270.1; 430/18; 430/189; 430/311; 430/319; 430/321; 430/326; 430/905

(58) Field of Classification Search
None
See application file for complete search history.

(56) References Cited

U.S. PATENT DOCUMENTS 8,158,981 B2   4/2012   Abe et al.

FOREIGN PATENT DOCUMENTS

| JP | 2933879 B2 | 5/1999 |
|---|---|---|
| JP | 2961722 82 | 8/1999 |
| JP | 378512 B2 | 3/2006 |
| JP | 2006-236838 A | 9/2006 |
| JP | 2007-119777 A | 5/2007 |
| JP | 2007-193318 A | 8/2007 |
| JP | 2009-186677 A | 8/2009 |
| JP | 2009-211033 A | 9/2009 |
| JP | 2010-39051 A | 2/2010 |

OTHER PUBLICATIONS

English Language Abstract from espacenet of JP 2933879 B2, (1999).
English Language Abstract from espacenet of JP 2961722 B2, (1999).
English Language Abstract from espacenet of JP 3783512 B2, (2006).

*Primary Examiner* — Sin J. Lee
(74) *Attorney, Agent, or Firm* — Sangya Jain

(57) ABSTRACT

A positive photosensitive siloxane composition containing: a polysiloxane (Ia), which is obtained by hydrolyzing and condensing the silane compound represented by $RSi(OR^1)_3$ in general formula (1) and the silane compound represented by $Si(OR^1)_4$ in general formula (2) in the presence of a basic catalyst, and a pre-baked film of which has a dissolution rate of 1,000 Å/second or less in a 5 wt % TMAH aqueous solution; a polysiloxane (Ib), which is obtained by hydrolyzing and condensing at least the silane compound represented by general formula (1) in the presence of an acid or basic catalyst, and a pre-baked film of which has a dissolution rate of 100 Å/second or more in a 2.38 wt % TMAH aqueous solution; and a diazonaphthoquinone derivative and solvent. (In the formula: R represents a linear, branched or cyclic alkyl group having 1 to 20 carbon atoms, in which any methylene may be replaced by oxygen, or represents an aryl group having 6 to 20 carbon atoms, in which any hydrogen may be replaced by fluorine; and $R^1$ is an alkyl group having 1 to 5 carbon atoms.)

14 Claims, 2 Drawing Sheets

POSITIVE PHOTOSENSITIVE SILOXANE COMPOSITION

This application is a United States National Stage Patent Application under 35 U.S.C. §371 of International Patent Application No. PCT/JP2011/068751, filed Aug. 19, 2011, which claims priority to Japanese Patent Application No. 2010-186986, filed Aug. 24, 2010, the contents of both documents being hereby incorporated herein by reference.

TECHNICAL FIELD

The present invention relates to an optically transparent photosensitive siloxane composition with a high temperature resistance, a high chemical resistance and a resistance for environment, which is able to form patterns by irradiation and is suitably used for a planarization film for a substrate of a thin film transistor (TFT) used in a back plane of a display such as a liquid crystal display element or an organic EL display element, an interlayer insulator, a solid image sensor, an antireflective film, an antireflective plate, an optical filter, a high luminance luminous diode, a touch panel, a solar cell, and an optical waveguide. The present invention further relates to a cured film formed by this photosensitive siloxane composition and an element with the cured film.

BACKGROUND ART

In recent years, various proposals for further improving the utilization efficiency of light and saving energy in an optical element such as displays, a light-emitting diode, and a solar cell have been done. For example, in a liquid crystal display, it is known to raise an aperture ratio of the display device by forming a planarization film on a TFT element by application, followed by forming a pixel electrode on the planarization film (see the patent document 1 below). In an organic EL device, it is also known to raise an aperture ratio thereof like the liquid crystal display by the adoption of a method, wherein emission light from a luminous layer which is formed on a transparent pixel electrode on a planarization layer provided on a TFT element by application is taken out from the opposite side of the TFT element, to be called a top emission method, instead of a method wherein emission light from a luminous layer which is formed by deposition on a transparent pixel electrode provided on a substrate is taken out from the side of the substrate, to be called a bottom emission method (see the patent document 2 below).

Furthermore, accompanying to an improved resolution, increasing in size, increasing in the picture quality, and the 3D indication of a display, delay in signals on wiring becomes a problem. Incoming signals to a TFT becomes shorter by increasing of a writing speed of the image data (frame frequency) but there is a limit to extension of the line-width for lowering a wiring resistance. Because of this, it was proposed to resolve the problem of the signal delay by increasing the thickness of wiring (see the non-patent document 1 below).

As materials for these planarization films of a TFT substrate, there are known materials containing an acrylic resin and a quinonediazide compound (see the patent documents 3 and 4 below). Though material properties of these materials, however, do not deteriorate sharply at a high temperature such as 200° C. or more, the decomposition thereof begins gradually at a high temperature such as 230° C. or more and there occurs problems such as lowering of the film thickness and transmittance deteriorations due to coloring of the transparent layer by a high temperature processing of the substrate. Particularly, these materials cannot be used in a process for forming a film on a layer of these materials at a high temperature, which is used in forming devices such as PE-CVD. In addition, these materials are not a best material for using in an organic EL element as decomposition products thereof affect badly to a luminescent efficient and life of an organic EL element. Furthermore, acrylic materials to which a heat resistance is given have a high dielectric constant generally. These materials, therefore, have problems that the electricity consumption becomes larger due to the increase in the parasitic capacitance or the picture quality decreases due to delay of a driving signal in a liquid crystal element. When an insulate material with a large dielectric constant is used, the capacitance can be made smaller by, for example, making a film layer thicker. However formation of a coated film with a uniform film thickness by these materials is difficult generally. In addition, the amount of materials used becomes larger. These materials, therefore, are not preferred.

Polysiloxanes, in particular a silsesquioxane is known as a high transparent material with a high thermal resistance. Though a silsesquioxane is a polymer constructed by a 3-functional siloxane structure unit: $Si(O_{1.5})$ and is a middle existence of an inorganic silica ($SiO_2$) and an organic silicone ($R_2SiO$) on the chemical structure, the polysiloxane is a singular compound as the compound is soluble in an organic solvent but a cured polysiloxane shows a high thermal resistance which is characteristics of an inorganic silica. When the polysiloxanes are used as a component of a photosensitive composition, it is needed that these are dissoluble in developers such as a tetramethylammonium hydroxide (TMAH) aqueous solution. Therefore, there are proposed a photosensitive composition comprising an acrylic copolymer copolymerized with a silsesquioxane compound in which an acrylic group is given to a particular caged silsesquioxane, an unsaturated carboxylic acid, an unsaturated compound containing an epoxy group and an olefin unsaturated compound, and a quinonediazide compound (see the patent document 5 below), and so on. As the composition comprising complicated systems contains a large amount of organic compounds except for the polysiloxane and a cured material thereof has an insufficient a thermal resistance due to the thermal deterioration of the organic compounds, the composition has problems of coloration and gas generation due to decomposition of the organic compounds and these problems cannot be ignored.

As a photosensitive composition, there is proposed, for example, a photosensitive composition comprising a polysiloxane which is insoluble in a developer, a polysiloxane which is soluble in a developer, and a quinonediazide compound and does not contain other reactive compounds except two kinds of polysiloxanes combined (see the patent document 6 below).

When a material consisting of only a polysiloxane and a quinonediazide compound is cured thermally, the cross-linkage and higher molecular weight formation occur by dehydration and condensation of silanol groups in the polysiloxane. In this thermal curing process, there must be prevented a 'pattern' sagging, that is, hole or line patterns obtained by the development flow due to a melt of a film by a low viscosity formation at a high temperature before sufficient proceeding of the thermal pattern curing to decrease the resolution of the patterns. From the patent document 6, it is necessary to raise the molecular weight of the siloxanes sufficiently for preventing the 'pattern' sagging. The photosensitive composition, therefore, has a low sensitivity and higher energy is needed for exposure. Further, the composition has faults such that the residual layer thickness thereof is not enough and the material loss is large.

CITATION LIST

Patent Documents

Patent document 1: JP 2933879 B
Patent document 2: JP 2006-236839 A
Patent document 3: JP 2961722 B
Patent document 4: JP 3783512 B
Patent document 5: JP 2007-119777 A
Patent document 6: JP 2007-193318 A Nonpatent Documents Non-patent document 1: IMID/IDMC/ASIA DISPLAY 2008 Digest (pages 9 to 12)

DISCLOSURE OF THE INVENTION

Problems to be Solved by the Invention

The present invention was made under the aforementioned situation. The object of the present invention is to provide a high resolution, high heat-resistance, and high transparency photosensitive siloxane composition with a high sensitivity and a high residual layer thickness, wherein a pattern sagging, which occurs easily during a heat curing, is suppressed without using a cross-linker or a siloxane compound which have a larger molecular weight. Another object of the present invention is to provide cured films such as a planarization film for a TFT substrate and an interlayer dielectric film, which are produced from the photosensitive siloxane composition, and a solid-state image sensing device, an antireflective film, an antireflective plate, an optical filter, a high luminance luminous diode, a touch panel, a solar cell, an optical device such as a light guide, and a semiconductor element, which include the cured film.

Means for Solving the Problems

As a result of intensive studies and investigations, the present inventors found that in a positive photosensitive siloxane composition containing diazonaphthoquinone derivatives and solvent, a 'pattern' sagging which occurs easily in a heat curing process can be prevented without increasing the molecular weight of the polysiloxane by using two kinds or more of particular polysiloxanes having different dissolution rates in a tetramethylammonium hydroxide aqueous solution as the polysiloxane, the positive photosensitive siloxane composition obtained has a high sensitivity and a high resolution, and a cured film formed by the positive photosensitive siloxane composition has a high residual film thickness. The present invention was accomplished based on these findings.

Namely, the present invention relates to positive photosensitive siloxane compositions described below.

(1) A positive photosensitive siloxane composition comprising (I) two kinds or more of polysiloxanes which have different dissolution rates in a tetramethylammonium hydroxide aqueous solution each other, (II) a diazonaphthoquinone derivative, and (III) solvent,
wherein the polysiloxane (I) is a mixture of
a polysiloxane (Ia) which is a polysiloxane, a prebaked film of which is soluble in a 5% tetramethylammonium hydroxide (hereinafter, it may be abbreviated to "5% TMAH".) aqueous solution, a dissolution rate of which is 1,000 Å/second or less in a 5% TMAH aqueous solution, and which is obtained by hydrolyzing and condensing, in the presence of a basic catalyst, a silane compound represented by the formula (1):

$RSi(OR^1)_3$ and a silane compound represented by the formula (2):

$Si(OR^1)_4$ in which R represents a linear, branched or cyclic alkyl group having 1 to 20 carbon atoms, any methylene group of which may be replaced by an oxygen atom, or an aryl group having 6 to 20 carbon atoms, in which any hydrogen atom may be replaced by a fluorine atom, and $R^1$ represents an alkyl group having 1 to 5 carbon atoms and
a polysiloxane (Ib) which is a polysiloxane, a prebaked film of which has a dissolution rate of 100 Å/second or more in a 2.38% tetramethylammonium hydroxide (hereinafter, it may be abbreviated to "2.38% TMAH".) aqueous solution and which is obtained by hydrolyzing and condensing at least a silane compound represented by the formula (1) described above in the presence of an acidic or basic catalyst.

(2) The positive photosensitive siloxane composition described in the item (1) above, wherein the polysiloxane (Ib) is obtained by using further a silane compound represented by the formula (2).

(3) The positive photosensitive siloxane composition described in the item (1) or (2) above, wherein the dissolution rate of the polysiloxane (I) in a 2.38% TMAH aqueous solution is 10 Å/second to 1,000 Å/second.

(4) The positive photosensitive siloxane composition described in any one of the items (1) to (3) above, wherein the dissolution rate of a prebaked film of the polysiloxane (Ib) in a 2.38% TMAH aqueous solution is 4,000 Å/second or more and the dissolution rate of a prebaked film of the polysiloxane (I) in a 2.38% TMAH aqueous solution is 100 Å/second to 1,000 Å/second.

(5) The positive photosensitive siloxane composition described in any one of the items (1) to (4) above, wherein the amount of polysiloxane (Ia) in the polysiloxane (I) is 1 to 80 wt %.

(6) The positive photosensitive siloxane composition described in any one of the items (1) to (5) above, wherein the polysiloxane (Ib) is obtained by hydrolyzing and condensing the aforementioned silane compound or compounds in the presence of a basic catalyst.

(7) The positive photosensitive siloxane composition described in any one of the items (1) to (6) above, wherein the polysiloxane (Ia) contains the silane compound represented by the formula (2) in an amount of 1 mole-% to 40 mole-%.

(8) The positive photosensitive siloxane composition described in any one of the items (1) to (7) above, wherein the polysiloxane (Ib) contains the silane compound represented by the formula (2) in an amount of 1 mole-% to 40 mole-%.

(9) The positive photosensitive siloxane composition described in any one of the items (1) to (8) above, wherein the amount of a silane compound in which R is a methyl group is 20 mole-% to 80 mole-% in the silane compound (1).

(10) The positive photosensitive siloxane composition described in any one of the items (1) to (9) above, which contains a curing aid that can generate an acid or base by heat or radiation.

(11) The positive photosensitive siloxane composition described in any one of the items (1) to (10) above, which contains a crown ether.

(12) A cured film which is formed by the positive photosensitive siloxane composition described in any one of the items (1) to (11) above.

(13) An element having the cured film described in the item (12).

(14) The element described in the item (13) above, wherein a dielectric constant of the cured film is 4 or less.

Advantageous Effects of the Invention

The photosensitive siloxane composition of the invention has a high sensitivity and a high resolution. In addition, the cured film obtained from the composition has an excellent heat-resistance, a high transparency, and an excellent residual film thickness after development and there is no deterioration of resolution by a heat pattern sagging. Furthermore, as the planarization and electric insulation of the cured film are superior, the composition can be used preferably as various film-forming materials used for preparing a planarization film for a substrate of a thin film transistor (TFT) used in a back plane of displays such as a liquid crystal display element and an organic EL display element, an interlayer insulator of semiconductor element, and various films such as insulator films or transparent protective films of a solid image sensor, an antireflective film, an antireflective plate, an optical filter, a high luminance luminous diode, a touch panel, a solar cell, and so on, as well as optical devices such as an optical waveguide.

MODE FOR CARRYING OUT THE INVENTION

Figure 1:
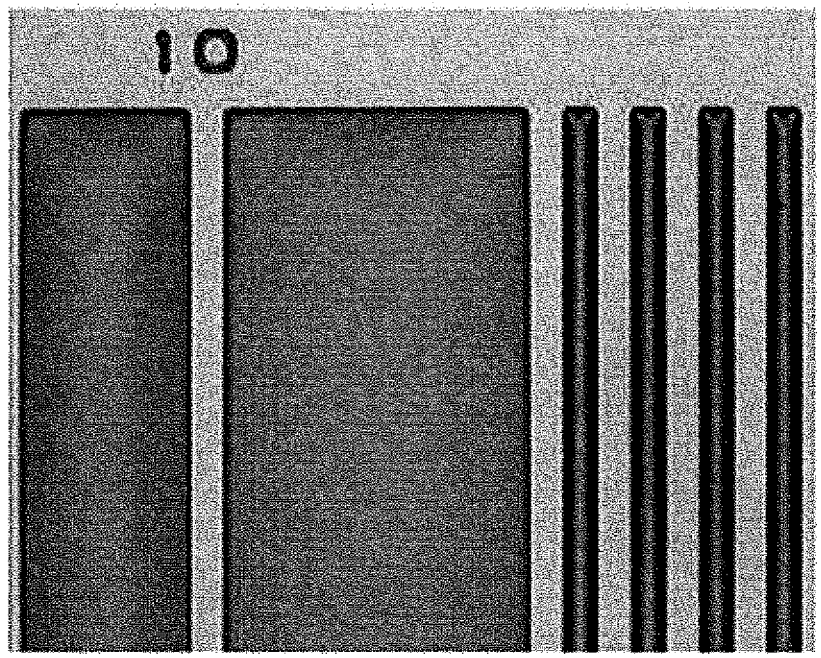
FIG. 1 is a photomicrograph of a 10 μm cured line and space (L/S) pattern and a 10 μm cured contact hole (C/H) pattern at 250° C., which were obtained in Example 5.

Hereinafter, a positive photosensitive siloxane composition of the invention will be explained more specifically.

The positive photosensitive siloxane composition of the invention is characterized by comprising two kinds or more of polysiloxanes having a different dissolution rate in a tetramethylammonium hydroxide aqueous solution each other, a diazonaphthoquinone derivative, and solvent as described above. Polysiloxanes, diazonaphthoquinone derivatives, and solvent, which are used for the positive photosensitive polysiloxane composition of the invention, will be explained in detail in order below.

(I) Polysiloxanes

First, special features of polysiloxanes used in the invention will be explained.

Polysiloxanes used in the invention include two kinds or more of polysiloxanes (Ia) and (Ib) having a different dissolution rate in a tetramethylammonium hydroxide (TMAH) aqueous solution each other.

By the way, in the case where a photosensitive siloxane composition containing a diazonaphthoquinone derivative as a dissolution inhibitor is developed using a 2.38% TMAH aqueous solution as a developer, it is possible to form practically a positive pattern to a film of 1,000 Å or more in thickness by exposure and development when the dissolution rate of the polysiloxane in a 2.38% TMAH aqueous solution is 10 Å/second or more. Herein the term "practically" means a developing time within several minutes. These materials, however, cause a thermal sagging usually in a heat curing process.

This thermal sagging can be prevented by using a polysiloxane with a low dissolution rate. However, as described above, when a molecular weight of a polysiloxane is made larger to be slightly soluble to a developer of a 2.38% TMAH aqueous solution, problems such as decline of resolution caused by not dissolved materials after development and deterioration of sensitivity are caused.

From this reason, the present invention is characterized by that at least two kinds of polysiloxane are used and as at least one polysiloxane, there is used a polysiloxane (Ia) which is slightly soluble in a 2.38% TMAH aqueous solution and is prepared by hydrolyzing and condensing a silane compound represented by the formula (1): $RSi(OR^1)_3$ and a silane compound represented by the formula (2): $Si(OR^1)_4$ in the presence of a basic catalyst and a prebaked film of which is soluble in a 5% TMAH aqueous solution and has a dissolution rate of 1,000 Å/second or less in a 5% TMAH aqueous solution. In addition, as a polysiloxane with a dissolution rate of 1,000 Å/second or less in a 5% TMAH aqueous solution is slightly soluble in a 2.38% TMAH aqueous solution developer, the polysiloxane (Ia) is almost insoluble in a 2.38% TMAH aqueous solution. On the other hand, when insoluble completely, developing residues due to the polysiloxane partially not dissolved, deterioration of sensitivity etc. occur even if the molecular weight is 5,000 or lower. Therefore, the polysiloxane which is soluble in a 5% TMAH aqueous solution and has a dissolution rate of 1,000 Å/second or less is used in the invention and problems of the dissolution residue and the deterioration of sensitivity hereby become unremarkable. From these reasons, the polysiloxanes of the invention can be used preferably.

In the invention, a polysiloxane (Ib) having a high dissolution rate, which is prepared by hydrolyzing and condensing at least one kind of silane compounds represented by the formula (1) in the presence of an acidic or basic catalyst and which has a dissolution rate of 100 Å/second or more in a 2.38% TMAH aqueous solution after prebaking, is used in combination with the aforementioned polysiloxane (Ia) having a low dissolution rate.

In the preparation of the polysiloxane (Ib), it is not essential to use a basic catalyst and a silane compound represented by the formula (2), which are necessary for preventing the pattern sagging. However when the anti-pattern sagging effect is provided by use of the basic catalyst or introducing of the silane compound represented by the formula (2), the amount of polysiloxane (Ia) required can be reduced. This produces good results for the problems of the dissolution residue and reducing of sensitivity.

If the polysiloxane (Ia) contains a larger amount of silica compound represented by the formula (2), the use of the silica compound (2) is not always necessary in the polysiloxane (Ib) However, when the function of decreasing the pattern sagging is provided excessively by increasing the content of the silane compound represented by the formula (2) in the polysiloxane (Ia), problems such as reduction of sensitivity etc. are considered. It is, therefore, preferable to use the silane compound represented by the formula (2) as constituents of both polysiloxane (Ia) and polysiloxane (Ib).

When a silane compound represented by the formula (2) is used in polysiloxanes (Ia) and (Ib), the compound is introduced into the polysiloxanes (Ia) and (Ib) as a silica in the hydrolysis and condensation process. By this, the density of cross-linking increases and a higher anti-pattern sagging effect is shown. The amount of the silane compound represented by the formula (2) is preferably 1 mole-% to 40 mole-% in the polysiloxane (Ia). When the silane compound represented by the formula (2) is also contained in the polysiloxane (Ib), the amount of the silane compound (2) is preferably 1 mole-% to 40 mole-% in the polysiloxane (Ib). When the amount of the silane compound represented by the formula (2) is less than 1 mole-%, an anti-pattern sagging effect is not enough and when more than 40 mole-%, the silane compound is separated and precipitated.

As described above, an anti-'pattern' sagging effect is mainly brought by polysiloxane (Ia). The amount of the polysiloxane (Ia) may be adjusted according to a film thickness and a shape or size of a pattern. The amount of the polysiloxane (Ia) is preferably 1 wt % to 80 wt % of the total weight of the polysiloxanes (Ia) and (Ib). When the amount is less than 1 wt %, the effect by addition thereof is not sufficient and when more than 80 wt %, problems of the developing dissolution remains and the decreasing of sensitivity occur. The amount is more preferably 20 wt % to 50 wt %.

A weight average molecular weight (Mw) of the polysiloxanes (Ia) and (Ib) mixture is 5,000 or less, preferably about 1,000 to 2,500. When the weight average molecular weight is less than 1,000, an anti-'pattern' sagging effect is small. On the other hand, when more than 5,000, sufficient resolution is not obtained due to the dissolution remains at development and reducing of sensitivity.

When the dissolution rate of the polysiloxane (Ia) in a 5% TMAH aqueous solution is 1,000 Å/second or less or the dissolution rate of the polysiloxane (Ib) in a 2.38% TMAH aqueous solution is 100 Å/second or more, problems of the dissolution remains and deterioration of sensitivity become unremarkable. A dissolution rate of the polysiloxanes (Ia) and (Ib) mixture in a 2.38% TMAH aqueous solution may be also set so that good results are obtained according to a film thickness of the cured film produced by the positive photosensitive siloxane composition of the invention or a development time. The dissolution rate of the mixture can be adjusted by changing the mixing ratio of the polysiloxanes (Ia) and (Ib). The dissolution rate of the mixture in a 2.38% TMAH aqueous solution is preferably 10 to 1,000 Å/second, more preferably 100 to 700 Å/second, when the film thickness is, for example, 0.1 to 10 μm (1,000 to 100,000 Å). It changes, however, by the kind or amount of a photosensitizes contained in the positive photosensitive siloxane composition.

Polysiloxanes (Ia) and (Ib) used in the siloxane resin composition of the invention can be prepared by hydrolyzing and condensing siloxane compounds represented by the formulae (1) and (2) in the presence of a acidic or basic catalyst in an organic solvent. The polysiloxanes (Ia) and (Ib) will be explained specifically below.

(a) Polysiloxane (Ia)

In the formula (1): $RSi(OR^1)$ and the formula (2): $Si(OR^1)$ use of which are necessary at least for preparing the polysiloxane (Ia), R represents a liner, branched or cyclic alkyl group having 1 to 20 carbon atoms, in which any methylene groups may be replaced by an oxygen atom, or an aryl group having 6 to 20 carbon atoms, in which any hydrogen atoms may be replaced by a fluorine atom, and $R^1$ represents an alkyl group having 1 to 5 carbon atoms. These silane compounds represented by the formulae (1) and (2) each may be used alone or in combination of two kinds or more thereof.

Examples of the liner, branched or cyclic alkyl group having 1 to 20 carbon atoms, in which any methylene groups may be replaced by an oxygen atom, in the group R include, but are not limited to, a methyl group, an ethyl group, a n-propyl group, an isopropyl group, a t-butyl group, a n-hexyl group, a n-decyl group, a trifluoromethyl group, a 2,2,2-trifluoroethyl group, a 3,3,3-trifluoropropyl group, and a cyclohexyl group. Of these, compounds in which R is a methyl group are particularly preferred, as the raw materials thereof can be easily obtained, film hardness of a cured film is high, and a chemical resistance is high.

Examples of the aryl group having 6 to 20 carbon atoms, in which any hydrogen atoms may be replaced by a fluorine atom, in group R include, but are not limited to, a phenyl group and a tolyl group. Of these, a phenyl group is preferred as solubility raises and less cracking of a cured film occurs by introducing the phenyl group into the compound.

Further, when the silane compound represented by the formula (1) comprises multiple different compounds, $R^5$ in the multiple compounds may be same or different each other.

Examples of the alkyl group having 1 to 5 carbon atoms of $R^1$ in the formulae (1) and (2) include, but are not limited to, a methyl group, an ethyl group, a n-propyl group, an isopropyl group, and a n-butyl group. $R^1$s in a compound may be same or different each other and when the silane compounds represented by the formulae (1) and (2) comprise multiple different compounds, $R^1$s in the multiple different compounds may be same or different each other.

Specific examples of the silane compounds represented by the formula (1) include, but are not limited to, methyltrimethoxysilane, methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, phenyltrimethoxysilane, phenyltriethoxysilane, trifluoromethyltrimethoxysilane, trifluoromethyltriethoxysilane, and 3,3,3-trifluoropropyltrimethoxysilane. Of these, methyltrimethoxysilane, methyltriethoxysilane, phenyltrimethoxysilane and phenyltriethoxysilane are preferable compounds as being easily available.

Specific examples of silane compounds represented by the formula (1) include, but are not limited to, tetramethoxysilane, tetraethoxysilane, tetrapropoxysilane, and tetrabutoxysilane. Of these, tetramethoxysilane and tetraethoxysilane are preferred as these compounds have a high reactivity.

The polysiloxane (Ia) of the invention is prepared by hydrolyzing silane compounds represented by the formulae (1) and (2) in the presence of a basic catalyst and condensing the hydrolyzed compounds in order.

In the production thereof, a mixture of silane compounds represented by the formulae (1) and (2) is added dropwise to a mixed solution of an organic solvent, a basic catalyst, and water to hydrolyze and condense the silane compounds, followed by neutralization, purification by washing, and substitution of reaction solvent by a desired organic solvent, if necessary, thus the polysiloxane (Ia) being produced.

Solvent used in the reaction may be utilized alone or in combination of two kinds or more thereof. Specific examples of solvent include, but are not limited to, hydrocarbon solvents such as hexane, toluene, xylene, and benzene; ether solvents such as diethyl ether and tetrahydrofuran; ester solvents such as ethylacetate, alcohol solvents such as methanol, ethanol, isopropanol, and butanol; and ketone solvents such as acetone, methyl ethyl ketone, and methyl isobutyl ketone. The amount thereof is 0.1 to 10 weight times, preferably 0.5 to 2 weight times a mixture solution of the silane compounds.

The addition and reaction temperatures of the silane compound mixture solution both are 0 to 200° C., preferably 10 to 60° C. and these reaction temperatures may be same or different each other. The reaction time is changed by substituent $R^1$ of silane compounds represented by the formula (1) or (2) but is usually from several ten minutes to several ten hours. Conditions at the hydrolysis and condensation reactions such as the amount of a basic catalyst, the reaction temperature, the reaction time etc. are set by considering a scale of reaction, a size of the reaction vessel, and the shape thereof. By these, polysiloxanes having suitable properties for an intended use can be obtained.

Examples of the basic catalyst include, but are not limited to, organic bases such as triethylamine, tripropylamine, tributylamine, tripentylamine, trihexylamine, triheptylamine, trioctylamine, diethylamine, triethanolamine, diethanolamine, and alkoxysilanes having amino group(s); inorganic bases such as sodium hydroxide and potassium hydroxide; anion exchange resins; quaternary ammonium salts such as tetrabutylammonium hydroxide, tetraethylammonium hydroxide, and tetramethylammonium hydroxide; and the like. The amount of the catalyst is preferably 0.0001 to 10 mole times a mixture of silane compounds.

Degree of hydrolysis may be adjusted by the amount of water in the presence of a catalyst. It is preferred to react with water of 0.01 to 10 mole times, preferably 0.1 to 5 mole times a hydrolyzable alkoxy group in the silane compounds represented by the formulae (1) and (2). When the amount of water is less than the aforementioned range, that is 0.01 mole times, the degree of the hydrolysis becomes low. That is unfavorable as a formation of a film becomes difficult. On the other hand, when the amount of water is more than the aforementioned range, gelation is likely to occur. That is also unfavorable as stability at storage becomes worse. The water used is preferably ion-exchanged or distilled water.

After the reaction, the reaction solution may be neutralized in pH neutral or somewhat acidic side pH with an acidic compound as a neutralizing agent. Examples of the acidic compound include, but are not limited to, inorganic acids such as phosphoric acid, nitric acid, sulfuric acid, hydrochloric acid, and hydrofluoric acid; polyvalent carboxylic acids such as acetic acid, trifluoroacetic acid, formic acid, lactic acid, acrylic acid, oxalic acid, maleic acid, succinic acid, and citric acid and anhydrides thereof; organic acids, for example, sulfonic acids such as p-toluenesulfonic acid and methanesulfonic acid and so on; cationic ion-exchange resins; and the like.

The amount of the neutralizing agent is selected as needed according to the pH value of the reaction solution containing polysiloxane (Ia) and it is preferably 0.5 to 1.5 mole times, more preferably 1 to 1.1 mole times a basic catalyst.

After neutralization, the neutralized solution may be washed and refined according to required properties to the coated film or the required self life and stability of the solution containing polysiloxane (Ia). The washing and refining are conducted as follows. That is, hydrophobic organic solvent and water, if needed, are added to the neutralized solution, followed by mixing and contacting to dissolve at least polysiloxane (Ia) in the solvent. As the hydrophobic organic solvent, an unmiscible compound with water may be used. The term "unmiscible" means that water and organic solvent are separated into two layers, a water layer and an organic layer when water and organic solvent are left to stand after mixed sufficiently.

Preferred examples of the hydrophobic organic solvent include, but are not limited to, ether solvents such as diethyl ether, ester solvents such as ethyl acetate, alcohol solvents such as butanol, ketone solvents such as methyl ethyl ketone and methyl isobutyl ketone, aromatic solvents such as toluene and xylene, and the like. The solvent may be the same as or different from the reaction solvent used in the reaction of silane compounds. The solvent may be used alone or in combination of two kinds or more thereof. By washing of the reaction solution, most of the basic catalyst and the acidic neutralizing agent which were used hitherto, and salts of the basic catalyst with the acidic neutralizing agent as well as alcohol and water which are reaction byproducts are contained in the water phase and these are removed from the organic layer. Repeating of washing may be any numbers according to properties required to the coated film and the required shelf life and stability of the solution containing polysiloxane (Ia).

Unlimited temperature of washing is preferably 0° C. to 70° C., more preferably 10° C. to 60° C. Further, the temperature in separation of a water layer and an organic layer is not limited too. The temperature of separation is preferably 0° C. to 70° C., more preferably 10° C. to 60° C. from the view point of shortening the separation time of liquid.

After washing, the resulting organic solution containing a polysiloxane (Ia) may be used itself as a material for a coating film. However, depending on purposes, solvent, residual water and residual alcohol which is a byproduct formed in the reaction process may be further removed by condensation, the concentration of the polysiloxane (Ia) may be changed, or solvent in the resulting organic solution may be replaced with other solvent. The condensation may be conducted under an ordinary pressure (atmospheric pressure) or a reduced pressure, and enrichment can be changed by controlling the amount of distillation. The temperature at the condensation is 30 to 150° C., preferably 40 to 100° C. The replacement of solvent may be conducted by adding solvent timely and then condensing so that an intended solvent composition can be obtained.

The polysiloxane (Ia) used in the siloxane resin composition of the invention can be prepared by the process described above.

(b) Polysiloxane (Ib)

The polysiloxane (Ib) is prepared by hydrolyzing at least a silane compound represented by the formula (1) described above in the presence of an acidic or basic catalyst and condensing the hydrolyzed compound in order. Reaction solvents and basic catalysts used in the hydrolysis and condensation reactions may be the same materials as those used in preparing the polysiloxane (Ia). Specific manufacturing conditions such as a reaction temperature and a synthesis method and a synthesis process may be the same as those described in preparing polysiloxane (Ia).

Examples of the acidic catalyst include, but are not limited to, hydrochloric acid, nitric acid, sulfuric acid, hydrofluoric acid, phosphoric acid, acetic acid, trifluoroacetic acid, formic acid, polyvalent carboxylic acid and anhydride thereof, ion exchange resins, and so on. The amount of the catalyst added, which can be changed by the strength of the acid, is preferably 0.0001 to 10 mole times the amount of a silane compound mixture.

After the end of the reaction, the reaction solution may be neutralized as same as in the case of using a basic catalyst. When an acidic catalyst is used, a basic compound is used as a neutralizer. Examples of the basic compounds include organic bases such as trimethylamine, tripropylamine, tributylamine, tripentylamine, trihexylamine, triheptylamine, trioctylamine, diethylamine, triethanolamine, and diethanolamine, inorganic bases such as sodium hydroxide and potassium hydroxide, anion exchange resins, and quaternary ammonium salts such as tetrabutylammonium hydroxide, tetraethylammonium hydroxide, and tetramethylammonium hydroxide. The amount of the neutralizer may be as same as when a basic catalyst is used.

In addition, it was already described above that a compound represented by the formula (2) may be used further as a silane compound in production of the polysiloxane (Ib).

The polysiloxane (Ib) used in the siloxane resin composition of the invention can be prepared from the above.

A dissolution rate of the polysiloxane (Ib) in a 2.38% TMAH aqueous solution differs with a thickness of a film, a developing rate, and a sensitivity of photosensitizes added. The dissolution rate, however, is preferably 100 Å/second or more when the thickness of the film is 1,000 to 100,000 Å, more preferably 500 Å/second or more when the thickness of the film is 5,000 to 50,000 Å. When the dissolution rate of the polysiloxane (Ib) in a 2.38% TMAH aqueous solution is less than 100 Å/second, it is necessary to reduce the amount of polysiloxane (Ia), which is a slightly soluble compound, for making a dissolution rate of a mixture of polysiloxanes (Ia) and (Ib) in a 2.38% TMAH aqueous solution to 10 to 1,000 Å/second. However, it is unfavorable from the view point of preventing the heat sagging of patterns that the amount of polysiloxane (Ia) is few.

In addition, as a 2.38% TMAH aqueous solution is generally used as a developer at the present time, dissolution rates of polysiloxane (Ib) and polysiloxane (I) set in an aforementioned range. In the case where an aqueous solution having a different TMAH concentration is used as a developer, as long as dissolution rates of polysiloxane (Ib) and polysiloxane (I) are made to result in the same range as that of a 2.38% TMAH aqueous solution, same effects as the invention can be obtained. Furthermore, it is the same when an inorganic base such as sodium hydroxide except for TMAH is used.

(Measurement Method of Dissolution Rate in an Alkali Solution)

The dissolution rates of the polysiloxane (Ia), the polysiloxane (Ib), and the mixture of polysiloxane (Ia) and polysiloxane (Ib) are measured as follows. That is, a polysiloxane or a mixture thereof is diluted with propylene glycol monomenthyl ether acetate (PGMEA) to about 3.5 wt % and then dissolve the polysiloxane or the mixture therein by stirring with a stirrer for one hour at a room temperature. 1 cc of the thus obtained polysiloxane solution is dripped on a center of a 4-inch silicon wafer of 525 μm in thickness using a pipette in a clean room under an atmosphere of a temperature: 23.0±0.5° C. and a humidity: 50±5.0% and is spin coated at 2±0.1 μm in thickness. After this, solvent in the coated film is further removed by heating on a hot plate at 100° C. for 90 seconds. The thickness of the coated film is measured with a spectroscopic ellipsometer manufactured by Woolliam Co. The silicon wafer with the film is immersed and left to stand in a petri dish of 6 inches in diameter at 23.0±0.1° C., into which 100 ml of a 5% TMAH aqueous solution is fed when the film consists of the polysiloxane (Ia), or 100 ml of a 2.38% TMAH aqueous solution is fed when the film consists of the polysiloxane (Ib) or the mixture of polysiloxane (Ia) and polysiloxane (Ib), to measure a time until the film disappears entirely. The dissolution rate is calculated by dividing the film thickness by a time until an even thickness part of an early stage film having an error of approximately 100 Å and existing in a 10 mm inner part from the edge of the wafer disappears. When the dissolution rate is remarkably slow, after immersion in the alkali solution for a predetermined time, it is dried on a hot plate at 200° C. for 5 minutes to remove water absorbed during the measurement of the dissolution rate and measures the film thickness. The dissolution rate is calculated by dividing a variation amount of film thicknesses before and after immersion by an immersion time. The aforementioned measurement is repeated five times. The mean value of the thus obtained values is made to the dissolution rate of the polysiloxane (Ia), the polysiloxane (Ib), and the mixture of polysiloxane (Ia) and polysiloxane (Ib).

(II) Diazonaaphthoquinone Derivatives

The positive photosensitive siloxane composition of the invention is solubilized to an alkaline developer by exposure and the exposed parts thereof are removed by development to form a positive image. The diazonaphthoquinone derivatives of the invention are compounds wherein naphthoquinonediazide sulfonic acid is ester-linked to a compound having a phenolic hydroxyl group. The derivatives are not limited by their structures but ester compounds with a compound having one or more of phenolic hydroxyl groups are preferred. 4-Naphthoquinonediazide sulfonic acid or 5-naphthoquinonediazide sulfonic acid may be used as the naphthoquinonediazide sulfonic acid. As 4-naphthoquinonediazide sulfonate has an absorption in an i-line area (wave length: 365 nm), it is suitable for an i-line exposure. As 5-naphthoquinonediazide sulfonate has absorptions in a wide wavelength area, it is suitable for exposure with radiations having a wide wavelength area. It is, therefore, preferred to select 4-naphthoquinonediazide sulfonate or 5-naphthoquinonediazide sulfonate by wavelength of radiation used for exposure. The mixture of 4-naphthoquinonediazide sulfonate and 5-naphthoquinonediazide sulfonate can also be used.

Unlimited examples of compounds having a phenolic hydroxyl group include following compounds. Names of the compounds are trade names of HONSHU CHEMICAL CO., LTD except for bisphenol A.

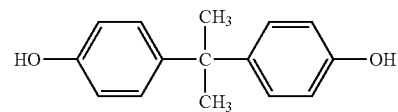

Bisphenol A

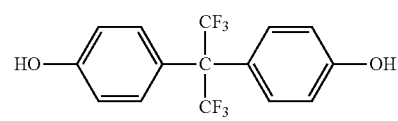

BisP-AF

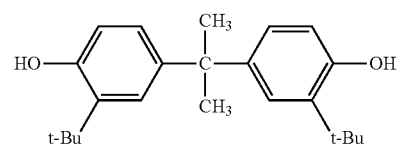

BisOTBP-A

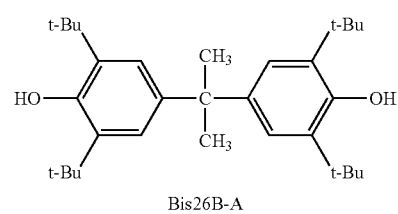

Bis26B-A

-continued
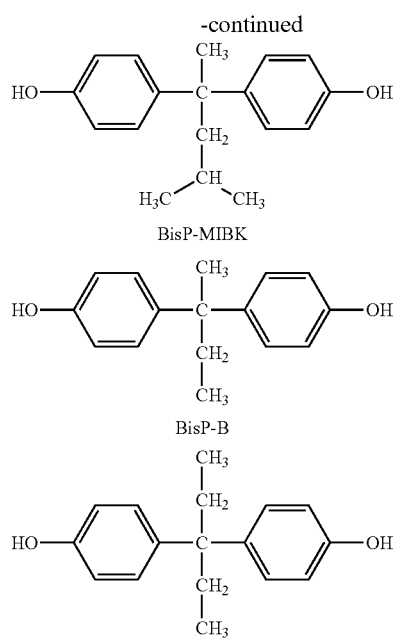
BisP-MIBK
BisP-B
BisP-DEK
BisP-PR
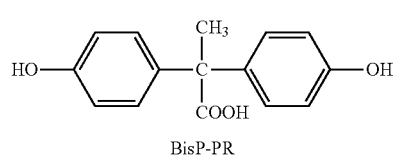
BisP-LV
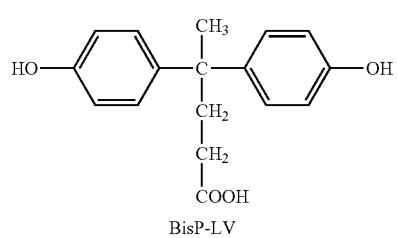
BisP-OT
BisP-NO
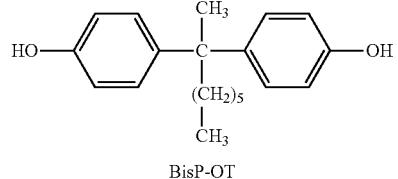
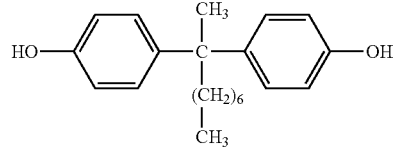
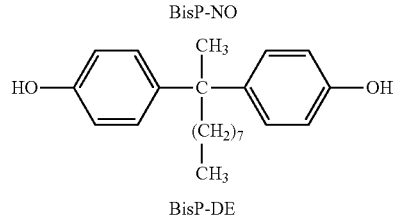
BisP-DE
-continued
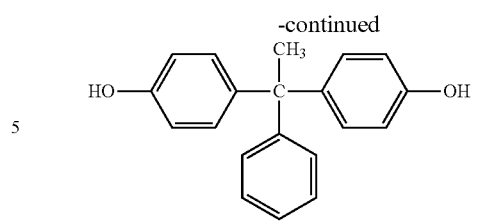
BisP-AP
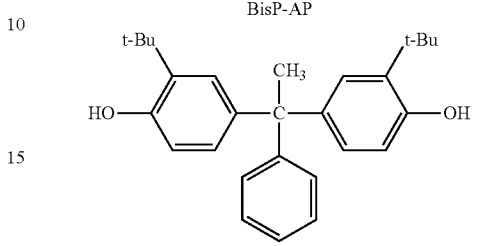
BisOTBP-AP
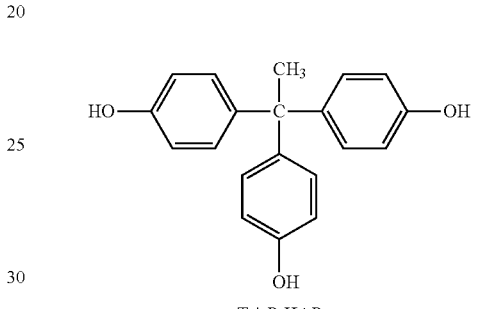
TrisP-HAP
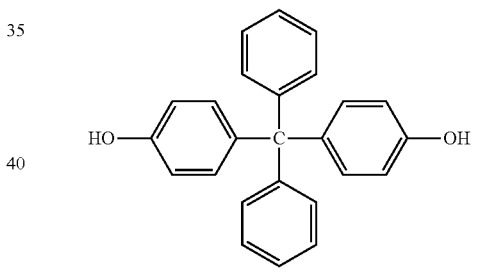
BisP-DP
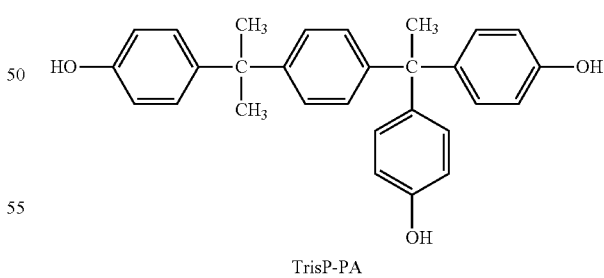
TrisP-PA
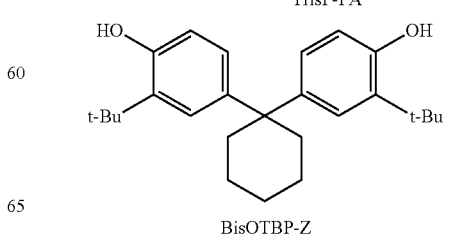
BisOTBP-Z

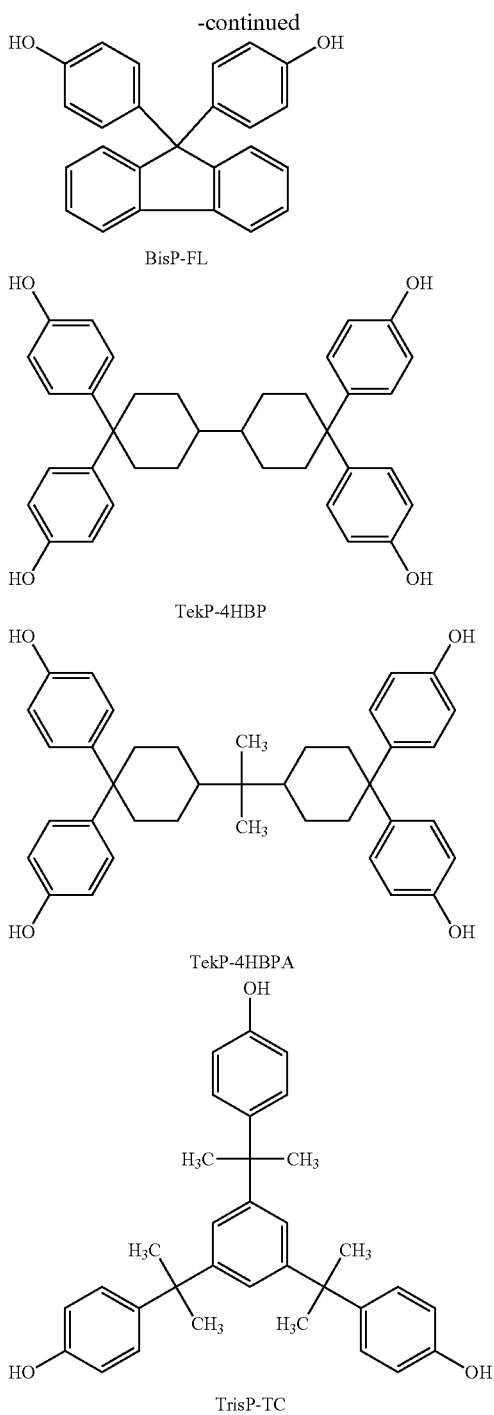

BisP-FL

TekP-4HBP

TekP-4HBPA

TrisP-TC

The optimal amount of the diazonaphthoquinone derivatives differs by the esterification rate of naphthoquinonediazide sulfonic acid, physical properties of polysiloxane used, and requested dissolution contrast between an irradiated part and an unirradiated part. The amount thereof is, however, preferably 3 to 20 wt %, more preferably 5 to 15 wt % of the total weight of polysiloxanes (Ia) and (Ib). When the amount of the diazonaphthoquinone derivatives is less than 3 wt %, the dissolution contrast between an exposed area and an unexposed area is too low and do not have a realistic sensitivity. For obtaining better dissolution contrast, the amount is preferably 8 wt % or more. On the other hand, when the amount of the diazonaphthoquinone derivatives is more than 20 wt %, whitening of the coated film can be occurred by a fall of compatibility between the polysiloxane and the quinonediazide compound or transparency of the cured film can be decreased by that coloring of the film by decomposition of quinonediazide compounds occurred during the heat curing becomes evident. Further, the heat resistance of the diazonaphthoquinone derivatives is lower than that of polysiloxane. Therefore, when the amount of the diazonaphthoquinone derivatives becomes larger, thermal decomposition thereof causes the deterioration of electric insulation of the cured film or the release of gas from the cured film. These can become problems in the later steps. In addition, the resistance for a photoresist stripper, which contains monoethanolamine and the like as a main agent, of the cured film can be decreased.

(III) Solvent

Examples of solvent include, but are not limited to, ethylene glycol monoalkyl ethers such as ethylene glycol monomethyl ether, ethylene glycol monoethyl ether, ethylene glycol monopropyl ether, and ethylene glycol monobutyl ether; diethylene glycol dialkyl ethers such as diethylene glycol dimethyl ether, diethylene glycol diethyl ether, diethylene glycol dipropyl ether, and diethylene glycol dibutyl ether; ethylene glycol alkyl ether acetates such as methylcellosolve acetate and ethylcellosolve acetate; propylene glycol alkyl ether acetates such as propylene glycol monomethyl ether acetate (PGMEA), propylene glycol monoethyl ether acetate, and propylene glycol monopropyl ether acetate; aromatic hydrocarbons such as benzene, toluene, and xylene; ketones such as methyl ethyl ketone, acetone, methyl amyl ketone, methyl isobutyl ketone, and cyclohexanone; alcohols such as ethanol, propanol, butanol, hexanol, cyclohexanol, ethylene glycol, and glycerin; esters such as ethyl 3-ethoxypropionate and methyl 3-ethoxypropionate; and cyclic esters such as γ-butyrolactone. These solvents may be used alone or in combination of two kinds or more thereof. The amount of the solvent differs by a coating method or a required film thickness.

When being applied by a spray coating method, the amount of solvent in a photosensitive siloxane composition becomes 90 wt % or more. When being applied by a slit coating method which is utilized in applying a large size substrate, the amount of solvent is usually 60 wt % or more, preferably 70 wt % or more based on the weight of the photosensitive siloxane composition. The properties of the positive photosensitive siloxane composition according to the present invention do not change largely by the amount of solvent.

Further, curing aids may be added to the composition of the invention. The curing aid can improve the resolution by strengthening the shape of the patterns and enhancing the development contrast. Examples of the curing aids include a photo acid generator which is decomposed by irradiation to generate an acid that is an active material in curing the composition, a photo base generator which generates a base as an active material, thermal acid generator which is decomposed by heating to generate an acid that is an active material in curing the composition, and a thermal base generator which generate a base as an active material. Examples of radiation include, for example, visible rays, ultraviolet rays, infrared rays, X-rays, an electron beam, an alpha ray and a gamma ray.

The optimal amount of curing aids varies by the kind of active materials which are generated by decomposition of the curing aids, a quantity of generation thereof, sensitivity required, and required dissolution contrast between an irradiated part and an unirradiated part. The amount thereof is preferably 0.001 to 10 wt %, more preferably 0.01 to 5 wt % based on the total weight of the polysiloxanes (Ia) and (Ib) in general. When the amount is less than 0.001 wt %, the dissolution contrast is too low and the effect by addition thereof is not shown. It is preferred that the amount of the curing aids is 0.01 wt % or more for obtaining a good dissolution contrast. On the other hand, when the amount of the curing aids is more than 10 wt %, cracks can occur in a coated film or colorlessness transparency can become lower by generation of salient coloration due to a decomposition of the curing aids in the cured layer. In addition, a larger amount of the curing aids causes the low electric insulation of the cured film or the release of gas by thermal decomposition of the curing aids in the cured film. These can give rise to problems at later steps. Further, resistance properties for a photoresist stripper, main agents of which are monoethanolamine and so on, of the cured film can deteriorate.

Examples of the photo acid generator include, but are not limited to, diazomethane compounds, diphenyliodonium salts, triphenylsulfonium salts, sulfonium salts, ammonium salts, phosphonium salts, sulfoneimide compounds, and so on. The structure of these photo acid generators can be represented by the formula (3):

$$R^+X^-$$

wherein $R^+$ represents an alkyl group, an aryl group, an alkenyl group, an acyl group, and an alkoxyl group, which may be modified by a hydrogen atom, an carbon atom or a hetero atom, and $X^-$ represents $BF_4^-$, $PF_6^-$, $SbF_6^-$, $SCN^-$, $(CF_3SO_2)_2N^-$, a carboxylic acid ion, a sulfonium ion, and so on.

Particularly preferred photo acid generators used in the present invention are compounds which generate sulfonic acids. Examples thereof include triphenylsulfonium trifluoromethanesulfonate, triphenylsulfonium camphorsulfonic acid, 4-acethoxyphenyldimethylsulfonium hexafluoroarsenate, 1-(4-n-butoxynaphthalene-1-yl)tetrahydrothiophenium trifluoromethanesulfonate, 1-(4,7-dibutoxy-1-naphthalenyl)tetrahydrothiophenium trifluoromethanesulfonate, and so on.

Examples of the thermo acid generator include salts or esters generating organic acids, for example, various fatty sulfonic acids and salts thereof; various fatty carboxylic acids such as citric acid, acetic acid and maleic acid and salts thereof; various aromatic carboxylic acids such as benzoic acid and phthalic acid and salts thereof; aromatic sulfonic acids and ammonium salts or various amine salts thereof; aromatic diazonium salts; phosphonic acids and salts thereof; etc. Of these thermo acid generators, salts formed from an organic acid and an organic base are preferred and salts formed from a sulfonic acid and an organic base are particularly preferred in the invention.

As preferred thermo acid generators containing sulfonic acid, there are exemplified p-toluenesulfonic acid, benzenesulfonic acid, p-dodecylbenzenesulfonic acid, 1,4-naththalenedisulfonic acid, methanesulfonic acid, etc. These may be used alone or in combination of two kinds or more thereof.

Examples of the photo base generator include multi-substituted amide compounds containing an amide group, lactams, imide compounds, and compounds including at least one of these structures.

As the aforementioned thermo base generators, there are exemplified imidazole derivatives such as N-(2-nitrobenzyloxycarbonyl)imidazole, N-(3-nitrobenzyloxycarbonyl)imidazole, N-(4-nitrobenzyloxycarbonyl)imidazole, N-(5-methyl-2-nitrobenzyloxycarbonyl)imidazole, and N-(4-chloro-2-nitrobenzyloxycarbonyl)imidazole; 1,8-diazabicyclo(5,4,0)undecene-7; tertiary amines; quaternary ammonium salts; and mixtures thereof. These thermo base generators may be used alone or in combination of two kinds or more thereof as with the photo acid generator.

The composition of the invention may include crown ethers. The addition of the crown ethers improves photosensitivity and preservation stability of the composition. Many crown ether compounds are known and any crown ether compounds can be selected depending on a purpose. Preferred crown ethers are those constituted by only carbon atoms, hydrogen atoms, and oxygen atoms. When the crown ether compound contains other atoms besides a carbon atom, a hydrogen atom, and an oxygen atom, the effects of the invention can be cancelled. Therefore, use of the crown ether compounds containing another atom is unfavorable. Particularly, when the crown ether compound contains an amino group or a quaternary ammonium group, it works as a catalyst for promoting a polymerization reaction of a silanol group-containing siloxane resin. As a result, the photosensitive composition tends to be thickened and it is unfavorable.

Nitrogen atom-containing groups beside an amino group and a quaternary ammonium salt have few problems for thickening of the compound, but coloring of a coated film can occur. For example, if an azo group, a diazo group or an oxime group is contained in a crown ether compound, little coloring will occur. On the other hand, when an amido group, an imino group, an imido group or a urea group is contained in a crown ether compound, coloring occurs in a coated film. It is, therefore, preferred that such compound is not used in a composition wherein transparency of the formed film is valued.

Crown ether compounds used in the invention may contain a hydroxyl group, a carboxyl group, an aromatic group or the like as a substituent. However, when an aromatic ring wherein a hydrogen atom is bonded at an alpha-position thereof is condensed on a crown ether ring, a coated film including this crown ether compound has a tendency of coloring after burning. Such crown ether compound, therefore, is unfavorable for use in the invention.

Crown ethers having simplest structure are represented by the formula: $(-CH_2-CH_2-O-)_n$. Of these, crown ethers in which n is 4 to 7 are preferred. Crown ether can be also called x-crown-y-ether wherein x is a total atom number constituting the cycle and y is a total number of oxygen atoms therein. In the invention, it is preferred to select from crown ether compounds consisting of x=12, 15, 18 or 21 and y=x/3, and benzo condensation compounds or cyclohexyl condensation compounds thereof. Examples of more preferred crown ether compounds include 21-crown-7-ether, 18-crown-6-ether, 15-crown-5-ether, 12-crown-4-ether, dibenzo-21-crown-7-ether, dibenzo-18-crown-6-ether, dibenzo-15-crown-5-ether, dibenzo-12-crown-4-ether, dicyclohexyl-21-crown-7-ether, dicyclohexyl-18-crown-6-ether, dicyclohexyl-15-crown-5-ether, and dicyclohexyl-12-crown-4-ether. Of these, it is most preferred to be selected from 18-crown-6-ether and 15-crown-5-ether.

Commercially available crown ethers sometimes contain impurities in general. When crown ethers including much alkali metal are used, these crown ethers accelerate a high molecular weight formation of the siloxane to make preservation stability such as sensitivity delay wrong. It is, therefore, unfavorable to use these crown ethers in the invention. As the amount of metal impurities to be allowed varies by preservation stability, a storage temperature, an amount of the crown ethers added, and a constitution of the photosensitive siloxane composition, the amount of the metal impurities is not settled unequivocally but it is preferred as low as possible.

Further, surfactants may be contained in the positive photosensitive siloxane composition of the invention, if necessary. The surfactants are added for the purposes of improving coating properties, developing properties etc. As surfactants being able to use in the present invention, there are exemplified nonionic surfactants, anionic surfactants, and amphoteric surfactants.

Examples of the nonionic surfactants include, but are not limited to, polyoxyethylene alkyl ethers such as polyoxyethylene lauryl ether, polyoxyethylene oleyl ether, and polyoxyethylene cetyl ether, polyoxyethylene fatty acid diesters, polyoxyethylene fatty acid monoesters, polyoxyethylene polyoxypropylene brock polymer, acetylene alcohols, acetylene glycols, polyethoxylates of acetylene alcohols, acetylene glycol derivatives such as polyethoxylates of acetylene glycols, fluorine atom-containing surfactants such as Fluorad (trade name, manufactured by Sumitomo 3M), Megafac (trade name, manufactured by DIC Corporation), and Sulflon (trade name, manufactured by ASAHI GLASS CO., LTD.), and organic siloxane surfactants such as KP341 (trade name, manufactured by Shin-Etsu Chemical Co., Ltd.). As the acetylene alcohols and acetylene glycols, there are exemplified 3-methyl-1-butyne-3-ol, 3-methyl-1-pentyne-3-ol, 3,6-dimethyl-4-octyne-3,6-diol, 2,4,7,9-tetramethyl-5-decyne-4,7-diol, 3,5-dimethyl-1-hexyne-3-ol, 2,5-dimethyl-3-hexyne-2,5-diol, 2,5-dimethyl-2,5-hexanediol, and so on.

Further, examples of the anionic surfactants include ammonium salts or organic amine salts of alkyldiphenyl ether disulfonic acids, ammonium salts or organic amine salts of alkyldiphenyl ether sulfonic acids, ammonium salts or organic amine salts of alkylbenzenesulfonic acids, ammonium salts or organic amine salts of polyoxyethylene alkyl ether sulfuric acids, and ammonium salts or organic amine salts of alkylsulfuric acids.

Examples of amphoteric surfactants include 2-alkyl-N-carboxymethyl-N-hydroxyethylimidazolium betaine, and lauric acid amide propylhydroxysulfone betaine.

These surfactants can be used alone or in a combination of two kinds or more thereof. The blending amount thereof is usually 50 to 2,000 ppm, preferably 100 to 1,000 ppm relative to the photosensitive siloxane composition of the invention.

Sensitizers may be contained in the positive photosensitive siloxane composition of the invention, if necessary. As the sensitizers preferably used in the present invention, there are exemplified coumarins, ketocoumarins, and derivatives thereof, thiopyrylium salts, acetophenones, and the like. Specific examples thereof include sensitizing dyes such as p-bis (o-methylstyryl)benzene, 7-dimethylamino-4-methylquinolone-2,7-amino-4-methylcoumarin, 4,6-dimethyl-7-ethylaminocoumarin, 2-(p-dimethylaminostyryl)-pyridylmethyl iodide, 7-diethylaminocoumarin, 7-diethylamino-4-methylcoumarin, 2,3,5,6-1H,4H-tetrahydro-8-methylquinolizino-<9,9a,1-gh>-coumarin, 7-diethylamino-4-trifluoromethylcoumarin, 7-dimethylamino-4-trifluoromethylcoumarin, 7-amino-4-trifluoromethylcoumarin, 2,3,5,6-1H,4H-tetrahydroxyquinolizino-<9,9a,1-gh>coumarin, 7-ethylamino-6-methyl-4-trifluoromethylcoumarin, 7-ethylamino-4-trifluoromethylcoumarin, 2,3,5,6-1H,4H-tetrahydro-9-carboethoxyquinolizino-<9,9a,1-gh>coumarin, 3-(2'-N-methylbenzimidazolyl)-7-N,N-diethylaminocoumarin, N-methyl-4-trifluoromethylpiperidino-<3,2-g>coumarin, 2-(p-dimethylaminostyryl)-benzothiazolylethyl iodide, 3-(2'-benzimidazolyl)-7-N,N-diethylaminocouma 3-(2'-benzthiazolyl)-7-N,N-diethylaminocoumarin, and pyrylium or thiopyrylium salts represented by the formulae described below. It becomes possible to expose with a cheap light source such as a high pressure mercury lamp (wavelength: 360 to 430 nm) by addition of the sensitizing dye.

| X | $R_1$ | $R_2$ | $R_3$ | Y |
|---|-------|-------|-------|---|
| S | $OC_4H_9$ | H | H | $BF_4$ |
| S | $OC_4H_9$ | H | H | $BF_4$ |
| S | $OC_4H_9$ | $OCH_3$ | $OCH_3$ | $BF_4$ |
| S | H | $OCH_3$ | $OCH_3$ | $BF_4$ |
| S | $N(CH_3)_2$ | H | H | $ClO_2$ |
| O | $OC_4H_9$ | H | H | $SbF_6$ |

The formation of a coating film in the present invention may be conducted by any one of conventional coating methods known as coating methods of the photosensitive siloxane composition, for example, a dip coating method, a roll coating method, a bar coating method, a brush coating method, a spray coating method, a doctor coating method, a flowing and spreading coating method, a spin coating method, a slit coating method and so on. The photosensitive siloxane composition may be applied to a suitable substrate such as a silicon substrate, a glass substrate, a resin film, and so on. When the substrate is a film, the application can also be conducted by a gravure printing method. A drying process of the coated film may be conducted as another process different from the coating process. The coating film can be applied one time or two times or more as necessary to make the thickness of the film to a desired thickness.

After forming of the coating film of photosensitive siloxane composition according to the invention, it is preferred to prebake (that is, heat treatment) the coated film for drying and reducing the amount of residual solvent in the film. The prebaking process may be conducted usually at 70 to 150° C., preferably at 90 to 120° C., and for 10 to 180 seconds, preferably for 30 to 90 seconds when using a hot plate or 1 to 30 minutes when using a clean oven.

Hereinafter a pattern forming method of the positive photosensitive siloxane composition according to the invention will be explained. Intended patterns are formed by following steps. First, a coating film of the positive photosensitive siloxane composition is formed on a substrate and prebaked. The film is pattern-wise exposed using light. As the light source, lamps such as a high pressure mercury lamp, a low pressure mercury lamp, a metal halide lamp and a xenon lamp, a laser diode, LED etc. can be used. As the irradiating light, ultraviolet rays such as g-line, h-line, i-line or the like is usually used. Except for an ultra micro fabrication such as a semiconductor processing, it is general to use the light of 360 nm to 430 nm (a high pressure mercury lamp) when patterning, wherein resolution from several micrometers to dozens micrometers is required, is conducted. In production of a liquid crystal display, a light of 430 nm is used in many cases. In these cases, it is advantageous to add a sensitizing dye to the photosensitive siloxane composition of the invention as previously stated. Energy of irradiation light varies by a light source used or a thickness of the coated film. However, the energy is made usually 10 to 2,000 mJ/cm$^2$, preferably 20 to 1,000 mJ/cm$^2$. When the energy of irradiation light is lower than 10 mJ/cm$^2$, the composition is not decomposed fully. On the contrary, when the energy is higher than 2,000 mJ/cm$^2$, halation can occur by over-exposing.

A photo mask generally used may be utilized for the pattern-wise irradiation of the coated film. The photo mask is well known by persons skilled in the art. Circumstances at the irradiation can be made the atmosphere of an environment (in the atmosphere) or the atmosphere of nitrogen gas. Further, the film in a whole surface may be formed by the full-exposure. In the invention, a patterned layer includes the case where a film is formed in a whole surface.

As a developer for the photosensitive siloxane composition of the invention, any one of developers for the conventional photosensitive siloxane compositions can be used. Preferred examples of the developer include alkaline developers such as aqueous solutions of tetraalkylammonium hydroxide, choline, alkali metal hydroxide, (hydrated) alkali metal metasilicate, (hydrated) alkali metal phosphate, aqueous ammonia, alkyl amine, alkanol amine, heterocyclic amine and the like. Of these, a tetramethylammonium hydroxide aqueous solution is particularly preferred. Water soluble organic solvents such as methanol and ethanol or surfactants may be contained in the alkali developer. After development using an alkali developer, washing with water is conducted usually. After this, when the film is used as a transparent film, it is preferred to conduct a bleaching exposure. By the bleaching exposure unreacted diazonaphthoquinone derivatives in the film are photodecomposed and transparency of the film is improved. The bleaching exposure may be conducted by full-exposing the film at about 100 mJ/cm$^2$ to about 2,000 mJ/cm$^2$ (conversion to exposure value of wavelength 365 nm) using an ultraviolet and visible light exposing equipment such as PLA.

After development, curing of the coated film is conducted by heating the patterned film. Heat conditions may be any one of temperatures being able to cure the coated film and it is usually at 150 to 400° C., preferably at 200 to 350° C. when the temperature is lower than 150° C., sufficient chemical resistance are not shown as unreacted silanol groups continue to exist in the film. Further, polarity of a silanol group induces a high dielectric constant. For lowering the dielectric constant, it is preferred to cure the film at a temperature of 200° C. or more.

The thus obtained cured films have a thermal resistance of 400° C. or more, a light transmittance of 95% or more, and a relative dielectric constant of 4 or less, preferably 3.3 or less. As the cured film has a higher transmittance for light and a lower relative dielectric constant than those of acrylic materials so far used, it may be suitably utilized in diverse fields as a planarization film, a low temperature polysilicon inter layer insulator etc. of various elements such as a flat panel display (FPD), a buffer coating film for IC chip, and a transparent protective film and so on.

Example

Hereinafter, the invention will be specifically described with reference to examples and comparative examples. However, it should be understood that the present invention is not restricted by these examples and comparative examples by no means.

Synthesis Example

First, synthesis examples of polysiloxane concerning the present invention will be shown below. Following instruments are utilized for measuring a molecular weight and a dissolution rate of a polysiloxane.
GPC: HLC-8220 GPC (manufactured by TOSOH CORPORATION)
Spin coater: MS-A100 (manufactured by MIKASA CO, LTD)
Thickness gage: VM-1200 (manufactured by Dainippon Screen Mfg. Co., Ltd.)

Synthesis Example 1

Synthesis of Ia-1 Compound

To a 2-liter flask equipped with a mixer, a thermometer, and a condenser, 36.5 g of a 25 wt % tetramethylammonium hydroxide (TMAH) aqueous solution, 300 ml of isopropyl alcohol (IPA), and 1.5 g of water were charged. A mixture solution consisting of 44.6 g of phenyltrimethoxysilane, 34.1 g of methyltrimethoxysilane, and 3.8 g of tetramethoxysilane was prepared in a dropping funnel separately. The mixture solution was added dropwise into the 2-liter flask at 60° C. and then mixed for 3 hours at 60° C. The resulting solution was neutralized by adding 10% HCl aqueous solution. To the neutralized solution, 200 ml of toluene and 300 ml of water were added to separate the mixture solution into two layers. The thus obtained organic layer was concentrated under a reduced pressure to remove solvent and then propylene glycol monomethyl ether acetate (PGMEA) was added to the concentrate so that the solid concentration thereof becomes 40 wt %. The weight-average molecular weight (Mw) (polystyrene conversion) of the thus obtained Polysiloxane 1 was 1,420. The resin PGMEA solution was applied onto a silicon wafer so that the prebaked film thickness becomes 2 μm. The dissolution rate of the coated resin film in a 5% TMAH aqueous solution was measured. It was 950 Å/second.

Synthesis Example 2

Synthesis of Ia-2 Compound

To a 2-liter flask equipped with a mixer, a thermometer, and a condenser, 36.5 g of a 25 wt % TMAH aqueous solution, 800 ml of IPA, and 2.0 g of water were charged. A mixture solution consisting of 39.7 g of phenyltrimethoxysilane, 34.1 g of methyltrimethoxysilane, and 7.6 g of tetramethoxysilane were prepared in a dropping funnel separately. The mixture solution was added dropwise into the 2-liter flask at 10° C. and then mixed for 24 hours at 10° C. The resulting solution was neutralized by adding 10% HCl aqueous solution. To the neutralized solution, 400 ml of toluene and 100 ml of water were added to separate the mixture solution into two layers. The thus obtained organic layer was concentrated under a reduced pressure to remove solvent and then PGMEA was added to the concentrate so that the solid concentration thereof becomes 40 wt %. The molecular weight (polystyrene conversion) of the thus obtained Polysiloxane 2 was 2,200 by Mw. The resin PGMEA solution was applied onto a silicon wafer so that the prebaked film thickness becomes 2 μm. The dissolution rate of the coated resin film in a 5% TMAH aqueous solution was measured. It was 490 Å/second.

Synthesis Example 3

Synthesis of Ia-3 Compound

To a 2-liter flask equipped with a mixer, a thermometer, and a condenser, 36.4 g of a 25 wt % TMAH aqueous solution, 800 ml of IPA, and 2.9 g of water are charged. A mixture solution consisting of 29.7 g of phenyltrimethoxysilane, 34.1 g of methyltrimethoxysilane, and 15.2 g of tetramethoxysilane were prepared in a dropping funnel separately. The mixture solution was added dropwise into the 2-liter flask at 25° C. and then mixed for 48 hours at 25° C. The resulting solution was neutralized by adding 10% HCl aqueous solution. To the neutralized solution, 300 ml of toluene and 400 ml of water were added to separate the mixture solution into two layers. The thus obtained organic layer was concentrated under a reduced pressure to remove solvent and then PGMEA was added to the concentrate so that the solid concentration thereof becomes 40 wt %. The molecular weight (polystyrene conversion) of the thus obtained Polysiloxane 3 was 4,450 by Mw. The resin PGMEA solution was applied onto a silicon wafer so that the prebaked film thickness becomes 2 μm. The dissolution rate of the coated resin film in a 5% TMAH aqueous solution was measured. It was 210 Å/second.

Synthesis Example 4

Synthesis of Comparison 1 Compound

To a 2-liter flask equipped with a mixer, a thermometer, and a condenser, 36.4 g of a 25 wt % TMAH aqueous solution, 550 ml of IPA, and 1.0 g of water were charged. A mixture solution consisting of 49.6 g of phenyltrimethoxysilane and 34.1 g of methyl trimethoxysilane were prepared in a dropping funnel separately. The mixture solution was added dropwise into the 2-liter flask at room temperature and then mixed for 24 hours at room temperature. The resulting solution was neutralized by adding 10% HCl aqueous solution. To the neutralized solution, 700 ml of toluene and 100 ml of water were added to separate the mixture solution into two layers. The thus obtained organic layer was concentrated under a reduced pressure to remove solvent and then PGMEA was added to the concentrate so that the solid concentration thereof becomes 40 wt %. The molecular weight (polystyrene conversion) of the thus obtained Polysiloxane 4 was 1,730 by Mw. The resin PGMEA solution was applied onto a silicon wafer so that the prebaked film thickness becomes 2 μm. The dissolution rate of the coated resin film in a 5% TMAH aqueous solution was measured. It was 150 Å/second.

Synthesis Example 5

Synthesis of Comparison 2 Compound

To a 2-liter flask equipped with a mixer, a thermometer, and a condenser, 36.5 g of a 25 wt % TMAH aqueous solution, 800 ml of IPA, and 2.0 g of water are charged. Mixture solution of 39.7 g of phenyltrimethoxysilane, 34.1 g of methyltrimethoxysilane, and 7.6 g of tetramethoxysilane were prepared in a dropping funnel separately. The mixture solution was added dropwise into the 2-liter flask at 10° C. and then mixed for 24 hours at 10° C. The resulting solution was neutralized by adding 10% HCl aqueous solution. To the neutralized solution, 400 ml of toluene and 100 ml of water were added to separate the mixture solution into two layers. The thus obtained organic layer was concentrated under a reduced pressure to remove solvent and then PGMEA was added to the concentrate so that the solid concentration thereof becomes 40 wt %. The molecular weight (polystyrene conversion) of the thus obtained Polysiloxane 5 was 1,430 by Mw. The resin PGMEA solution was applied onto a silicon wafer so that the prebaked film thickness becomes 2 μm. The dissolution rate of the coated resin film in a 5% TMAH aqueous solution was measured. It was 1,200 Å/second.

Synthesis Example 6

Synthesis of Ib-1 Compound

To a 2-liter flask equipped with a mixer, a thermometer, and a condenser, 1.6 g of 35% HCl aqueous solution, 300 ml of PGMEA, and 27.4 g of water are charged. A mixture solution consisting of 49.6 g of phenyltrimethoxysilane and 34.1 g of methyltrimethoxysilane were prepared in a dropping funnel separately. The mixture solution was added dropwise into the 2-liter flask at 10° C. and then mixed for 6 hours at 10° C. To the reaction solution, 200 ml of toluene and 100 ml of water were added to separate the mixture solution into two layers. The thus obtained organic layer was concentrated under a reduced pressure to remove solvent and then PGMEA was added to the concentrate so that the solid concentration thereof becomes 40 wt %. The molecular weight (polystyrene conversion) of the thus obtained Polysiloxane 6 was 1,780 by Mw. The resin PGMEA solution was applied onto a silicon wafer so that the prebaked film thickness becomes 2 μm. The dissolution rate of the coated resin film in a 2.38% TMAH aqueous solution was measured. It was 11,100 Å/second.

Synthesis Example 7

Synthesis of Ib-2 Compound

To a 2-liter flask equipped with a mixer, a thermometer, and a condenser, 1.6 g of 35% HCl aqueous solution, 600 ml of PGMEA, and 28.3 g of water are charged. A mixture solution consisting of 39.7 g of phenyltrimethoxysilane, 34.1 g of methyltrimethoxysilane, and 7.6 g of tetramethoxysilane were prepared in a dropping funnel separately. The mixture solution was added dropwise into the 2-liter flask at 25° C. and then mixed for 1 hour at 25° C. To the reaction solution, 500 ml of toluene and 100 ml of water were added to separate the mixture solution into two layers. The thus obtained organic layer was concentrated under a reduced pressure to remove solvent and then PGMEA was added to the concentrate so that the solid concentration thereof becomes 40 wt %. The molecular weight (polystyrene conversion) of the thus obtained Polysiloxane 7 was 1,590 by Mw. The resin PGMEA solution was applied onto a silicon wafer so that the prebaked film thickness becomes 2 μm. The dissolution rate of the coated resin film in a 2.38% TMAH aqueous solution was measured. It was 9,530 Å/second.

Synthesis Example 8

Synthesis of Ib-3 Compound

To a 2-liter flask equipped with a mixer, a thermometer, and a condenser, 1.6 g of 35% HCl aqueous solution, 600 ml of PGMEA, and 29.3 g of water were charged. A mixture solution consisting of 29.7 g of phenyltrimethoxysilane, 34.1 g of methyltrimethoxysilane, and 15.2 g of tetramethoxysilane was prepared in a dropping funnel separately. The mixture solution was added dropwise into the 2-liter flask at 25° C. and then mixed for 1 hour at 25° C. To the reaction solution, 500 ml of toluene and 100 ml of water were added to separate the mixture solution into two layers. The thus obtained organic layer was concentrated under a reduced pressure to remove solvent and then PGMEA was added to the concentrate so that the solid concentration thereof becomes 40 wt %.

The molecular weight (polystyrene conversion) of the thus obtained Polysiloxane 8 was 1,290 by Mw. The resin PGMEA solution was applied onto a silicon wafer so that the prebaked film thickness becomes 2 μm. The dissolution rate of the coated resin film in a 2.38% TMAH aqueous solution was measured. It was 12,100 Å/second.

Synthesis Example 9

Synthesis of Comparison 3 Compound

To a 2-liter flask equipped with a mixer, a thermometer, and a condenser, 1.6 g of 35% HCl aqueous solution, 600 ml of PGMEA, and 28.3 g of water were charged. A mixture solution consisting of 39.7 g of phenyltrimethoxysilane, 34.1 g of methyltrimethoxysilane, and 7.6 g of tetramethoxysilane was prepared in a dropping funnel separately. The mixture solution was added dropwise into the 2-liter flask at 25° C. and mixed for 1 hour at 25° C., followed by continuing the reaction for 8 hours at 70° C. To the reaction solution, 500 ml of toluene and 100 ml of water were added to separate the mixture solution into two layers. The thus obtained organic layer was concentrated under a reduced pressure to remove solvent and then PGMEA was added to the concentrate so that the solid concentration thereof becomes 40 wt %. The molecular weight (polystyrene conversion) of the thus obtained Polysiloxane 9 was 2,090 by Mw. The resin PGMEA solution was applied onto a silicon wafer so that the prebaked film thickness becomes 2 μm. The dissolution rate of the coated resin film in a 2.38% TMAH aqueous solution was measured. It was 240 Å/second.

Synthesis Example 10

Synthesis of Ib-4 Compound

To a 2-liter flask equipped with a mixer, a thermometer, and a condenser, 54.7 g of a 25% TMAH aqueous solution and 800 ml of IPA are charged. A mixture solution consisting of 39.7 g of phenyltrimethoxysilane, 34.1 g of methyltrimethoxysilane, and 7.6 g of tetramethoxysilane was prepared in a dropping funnel separately. The mixture solution was added dropwise into the 2-liter flask at 55° C. and then mixed for 48 hours at 55° C. To the reaction solution, 500 ml of toluene and 200 ml of water were added to separate the mixture solution into two layers. The thus obtained organic layer was concentrated under a reduced pressure to remove solvent and then PGMEA was added to the concentrate so that the solid concentration thereof becomes 40 wt %. The molecular weight (polystyrene conversion) of the thus obtained Polysiloxane 10 was 1,720 by Mw. The resin PGMEA solution was applied onto a silicon wafer so that the prebaked film thickness becomes 2 μm. The dissolution rate of the coated resin film in a 2.38% TMAH aqueous solution was measured. It was 4,830 Å/second.

Synthesis Example 11

Synthesis of Ib-5 Compound

To a 2-liter flask equipped with a mixer, a thermometer, and a condenser, 2.0 g of 35% HCl aqueous solution, 600 ml of PGMEA, and 29.3 g of water were charged. A mixture solution consisting of 29.7 g of phenyltrimethoxysilane, 34.1 g of methyltrimethoxysilane, and 15.2 g of tetramethoxysilane was prepared in a dropping funnel separately. The mixture solution was added dropwise into the 2-liter flask at 45° C. and then mixed for 5 hours at 45° C. To the reaction solution, 500 ml of toluene and 100 ml of water were added to separate the mixture solution into two layers. The thus obtained organic layer was concentrated under a reduced pressure to remove solvent and PGMEA was added to the concentrate so that the solid concentration thereof becomes 40 wt %. The molecular weight (polystyrene conversion) of the thus obtained Polysiloxane 11 was 2,140 by Mw. The resin PGMEA solution was applied onto a silicon wafer so that the prebaked film thickness becomes 2 μm. The dissolution rate of the coated resin film in a 2.38% TMAH aqueous solution was measured. It was 370 Å/second.

Synthesis Example 12

Synthesis of Ib-6 Compound

To a 2-liter flask equipped with a mixer, a thermometer, and a condenser, 38.2 g of a 25% TMAH aqueous solution, 800 ml of IPA, and 2.9 g of water were charged. A mixture solution consisting of 29.7 g of phenyltrimethoxysilane, 34.1 g of methyltrimethoxysilane, and 15.2 g of tetramethoxysilane was prepared in a dropping funnel separately. The mixture solution was added dropwise into the 2-liter flask at 25° C. and then mixed for 24 hours at 25° C. The resulting solution was neutralized by adding 10% HCl aqueous solution. To the neutralized solution, 300 ml of toluene and 400 ml of water were added to separate the mixture solution into two layers. The thus obtained organic layer was concentrated under a reduced pressure to remove solvent and then PGMEA was added to the concentrate so that the solid concentration thereof becomes 40 wt %. The molecular weight (polystyrene conversion) of the thus obtained Polysiloxane 12 was 4,450 by Mw. The resin PGMEA solution was applied onto a silicon wafer so that the prebaked film thickness becomes 2 μm. The dissolution rate of the coated resin film in a 2.38% TMAH aqueous solution was measured. It was 1,240 Å/second.

Synthesis Example 13

Synthesis of Ib-7 Compound

To a 2-liter flask equipped with a mixer, a thermometer, and a condenser, 1.0 g of 35% HCl aqueous solution, 600 ml of PGMEA, and 28.3 g of water were charged. A mixture solution consisting of 39.7 g of phenyltrimethoxysilane, 34.1 g of methyltrimethoxysilane, and 7.6 g of tetramethoxysilane was prepared in a dropping funnel separately. The mixture solution was added dropwise into the 2-liter flask at 45° C. and then mixed for 5 hours at 45° C. To the reaction solution, 500 ml of toluene and 100 ml of water were added to separate the mixture solution into two layers. The thus obtained organic layer was concentrated under a reduced pressure to remove solvent and then PGMEA was added to the concentrate so that the solid concentration thereof becomes 40 wt %. The molecular weight (polystyrene conversion) of the thus obtained Polysiloxane 13 was 1,430 by Mw. The resin PGMEA solution was applied onto a silicon wafer so that the prebaked film thickness becomes 2 μm. The dissolution rate of the coated resin film in a 2.38% TMAH aqueous solution was measured. It was 1,000 Å/second.

Synthesis Example 14

Synthesis of Ib-8 Compound

To a 2-liter flask equipped with a mixer, a thermometer, and a condenser, 43.8 g of a 25% TMAH aqueous solution, 800 ml of IPA, and 2.9 g of water are charged. A mixture solution consisting of 39.6 g of phenyltrimethoxysilane and 40.8 g of methyltrimethoxysilane was prepared in a dropping funnel separately. The mixture solution was added dropwise into the 2-liter flask at 25° C. and then mixed for 24 hours at 25° C. The resulting solution was neutralized by adding 10% HCl aqueous solution. To the neutralized solution, 300 ml of toluene and 400 ml of water were added to separate the mixture solution into two layers. The thus obtained organic layer was concentrated under a reduced pressure to remove solvent and then PGMEA was added to the concentrate so that the solid concentration thereof becomes 40 wt %. The molecular weight (polystyrene conversion) of the thus obtained Polysiloxane 14 was 1,400 by Mw. The resin PGMEA solution was applied onto a silicon wafer so that the prebaked film thickness becomes 2 μm. The dissolution rate of the coated resin film in a 2.38% TMAH aqueous solution was measured. It was 470 Å/second.

Aforementioned synthesis examples of polysiloxane compounds are summarized in Table 1.

formed. After formation of patterns, it was cured by burning at 250° C. When observed with an optical microscope, the patterns kept a good shape though the edges thereof were rounded to some exert and the 10 μm patterns were kept. The dielectric constant thereof was measured by a mercury probe method using a measurement device 495 manufactured by Solid State Measurements Co. The measurement was conducted with a frequency of 100 KHz. The preparation of the sample for measurement was conducted as follows: a photosensitive siloxane composition used for measurement was applied onto a silicon wafer by a spin coating method, followed by prebaking on a hot plate at 100° C. for 90 seconds to prepare a photosensitive film of 0.5 μm in thickness. The silicon wafer was immersed in a 2.38% TMAH aqueous solution, followed by rinsing with pure water. Further, the patterns formed were full-exposed at a dose of 600 mJ/cm$^2$ using Canon PLA-501F, followed by burning to cure at 250° C. The dielectric constant of the resulting cured material was 3.1. In addition, measurements of the dielectric constant in

TABLE 1

| Synthesis Example | compound | Ph (phenyl) (mole-%) | Me (methyl) (mole-%) | Q (—SiO$_2$—) (mole-%) | catalyst | ADR (1) 5% TMAH Angstroms/second | ADR (2) 2.38% TMAH Angstroms/second |
|---|---|---|---|---|---|---|---|
| 1 | Ia-1 | 45 | 50 | 5 | Alkali | 950 | <1 |
| 2 | Ia-2 | 40 | 50 | 10 | Alkali | 490 | <1 |
| 3 | Ia-3 | 30 | 50 | 20 | Alkali | 210 | <1 |
| 4 | Comparison 1 | 50 | 50 | — | Alkali | 150 | <1 |
| 5 | Comparison 2 | 40 | 50 | 10 | Alkali | 1,200 | <1 |
| 6 | Ib-1 | 50 | 50 | — | Acid | | 11,100 |
| 7 | Ib-2 | 40 | 50 | 10 | Acid | | 9,530 |
| 8 | Ib-3 | 30 | 50 | 20 | Acid | | 12,100 |
| 9 | Comparison 3 | 40 | 50 | 10 | Acid | 240 | <1 |
| 10 | Ib-4 | 40 | 50 | 10 | Alkali | | 4,830 |
| 11 | Ib-5 | 30 | 50 | 20 | Acid | | 370 |
| 12 | Ib-6 | 30 | 50 | 20 | Alkali | | 1,240 |
| 13 | Ib-7 | 40 | 50 | 10 | Acid | | 1,000 |
| 14 | Ib-8 | 40 | 60 | — | Alkali | | 470 |

Example 1

Positive Photosensitive Siloxane Composition 80 wt % of Polysiloxane Ia-1 and 20 wt % of Polysiloxane Ib-1 were mixed and the mixture was prepared to a 35% concentration solution using PGMEA. On measuring the dissolution rate of the polysiloxane mixture in a 2.38% aqueous TMAH solution, it was 137 Å/second. To the polysiloxane mixture, 12 wt % of a modified compound of 4-4'-(1-(4-(1-(4-hydroxyphenol)-1-methylethyl)-phenyl)-ethylidene) bisphenol with 2.0 mole of diazonaphthoquinone (refer to 'PAC' below) to the total amount of polysiloxanes were added. Further, 0.3 wt % of a surfactant, KF-53 manufactured by Shin-Etsu Chemical Co., Ltd. to the total amount of polysiloxanes were added thereto to prepare a photosensitive siloxane composition.

The photosensitive polysiloxane composition was applied onto a silicon wafer by a spin coating, followed by prebaking on a hot plate at 100° C. for 90 seconds to prepare a photosensitive film of 2 μm in thickness. After prebaking, the film was exposed at a dose of 220 mJ/cm$^2$ with a g- and h-lines exposure machine, Nikon FX-604 (NA=0.1) and then developed with a 2.38% TMAH aqueous solution, followed by rinsing with pure water. As a result, it was confirmed that 10 μm clear line and space (L/S) patterns and 10 μm clear contact hole (C/H) patterns, both of which have no residue, were following Examples and Comparative examples were conducted by the same method as Example 1.

Example 2

Positive Photosensitive Siloxane Composition 75 wt % of Polysiloxane Ia-1 and 25 wt % of Polysiloxane Ib-2 were mixed and the mixture was prepared to a 35% concentration solution using PGMEA. On measuring the dissolution rate of the polysiloxane mixture in a 2.38% aqueous TMAH solution, it was 252 Å/second. To the polysiloxane mixture, 12 wt % of PAC to the total amount of polysiloxanes were added. Further, 0.3 wt % of a surfactant, KF-53 manufactured by Shin-Etsu Chemical Co., Ltd. to the total amount of polysiloxanes were added thereto to prepare a photosensitive siloxane composition.

The photosensitive polysiloxane composition was applied onto a silicon wafer by a spin coating, followed by prebaking on a hot plate at 100° C. for 90 seconds to prepare a photosensitive film of 2 μm in thickness. After prebaking, the film was exposed at a dose of 170 mJ/cm$^2$ with a g- and h-lines exposure machine, Nikon FX-604 (NA=0.1) and then developed with a 2.38% TMAH aqueous solution, followed by rinsing with pure water. As a result, it was confirmed that 5 μm clear line and space (L/S) patterns and 5 μm clear contact hole (C/H) patterns, both of which have no residue, were formed. The patterns were full-exposed with Canon PLA-501F at a dose of 600 mJ/cm² and then cured by burning at 250° C. When observed with an optical microscope, it was found that the patterns kept good shape though the edges thereof were rounded to some exert and the 5 µm patterns were kept. The dielectric constant thereof was 3.1.

Example 3

Positive Photosensitive Siloxane Composition 70 wt % of Polysiloxane Ia-1 and 30 wt % of Polysiloxane Ib-3 were mixed and the mixture was prepared to a 35% concentration solution using PGMEA. On measuring the dissolution rate of the polysiloxane mixture in a 2.38% aqueous TMAH solution, it was 487 Å/second. To the polysiloxane mixture, 12 wt % of PAC to the total amount of polysiloxanes were added. Further, 0.3 wt % of a surfactant, KF-53 manufactured by Shin-Etsu Chemical Co., Ltd. to the total amount of polysiloxanes were added thereto to prepare a photosensitive siloxane composition.

The photosensitive polysiloxane composition was applied onto a silicon wafer by a spin coating, followed by prebaking on a hot plate at 100° C. for 90 seconds to prepare a photosensitive film of 2 µm in thickness. After prebaking, the film was exposed at a dose of 130 mJ/cm² with a g- and h-lines exposure machine, Nikon FX-604 (NA=0.1) and then developed with a 2.38% TMAH aqueous solution, followed by rinsing with pure water. As a result, it was confirmed that 5 µm clear line and space (L/S) patterns and 5 µm clear contact hole (C/H) patterns, both of which have no residue, were formed. The patterns were full-exposed with Canon PLA-501F at a dose of 600 mJ/cm² and then cured by burning at 250° C. When observed with an optical microscope, it was found that the patterns kept good shape though the edges thereof were rounded to some exert and the 5 µm patterns were kept. The dielectric constant thereof was 3.1.

Example 4

Positive Photosensitive Siloxane Composition 70 wt % of Polysiloxane Ia-2 and 30 wt % of Polysiloxane Ib-1 were mixed and the mixture was prepared to a 35% concentration solution using PGMEA. On measuring the dissolution rate of the polysiloxane mixture in a 2.38% aqueous TMAH solution, it was 229 Å/second. To the polysiloxane mixture, 12 wt % of PAC to the total amount of polysiloxanes were added. Further, 0.3 wt % of a surfactant, KF-53 manufactured by Shin-Etsu Chemical Co., Ltd. to the total amount of polysiloxanes were added thereto to prepare a photosensitive siloxane composition.

The photosensitive polysiloxane composition was applied onto a silicon wafer by a spin coating, followed by prebaking on a hot plate at 100° C. to prepare a photosensitive film of 2 µm in thickness. After prebaking, the film was exposed at 170 mJ/cm² with a g- and h-lines exposure machine, Nikon FX-604 (NA=0.1) and then developed with a 2.38% TMAH aqueous solution, followed by rinsing with pure water. As a result, it was confirmed that 5 µm clear line and space (L/S) patterns and 5 µm clear contact hole (C/H) patterns, both of which have no residue, were formed. The patterns were full-exposed with Canon PLA-501F at a dose of 600 mJ/cm² and then cured by burning at 250° C. When observed with an optical microscope, it was found that the patterns kept good shape though the edges thereof were rounded to some exert and the 5 µm patterns were kept. The dielectric constant thereof was 3.2.

Example 5

Positive Photosensitive Siloxane Composition 66 wt % of Polysiloxane Ia-2 and 34 wt % of Polysiloxane Ib-2 were mixed and the mixture was prepared to a 35% concentration solution using PGMEA. On measuring the dissolution rate of the polysiloxane mixture in a 2.38% aqueous TMAH solution, it was 383 Å/second. To the polysiloxane mixture, 12 wt % of PAC to the total amount of polysiloxanes were added. Further, 0.3 wt % of a surfactant, KF-53 manufactured by Shin-Etsu Chemical Co., Ltd. to the total amount of polysiloxanes were added thereto to prepare a photosensitive siloxane composition.

Figure 2:
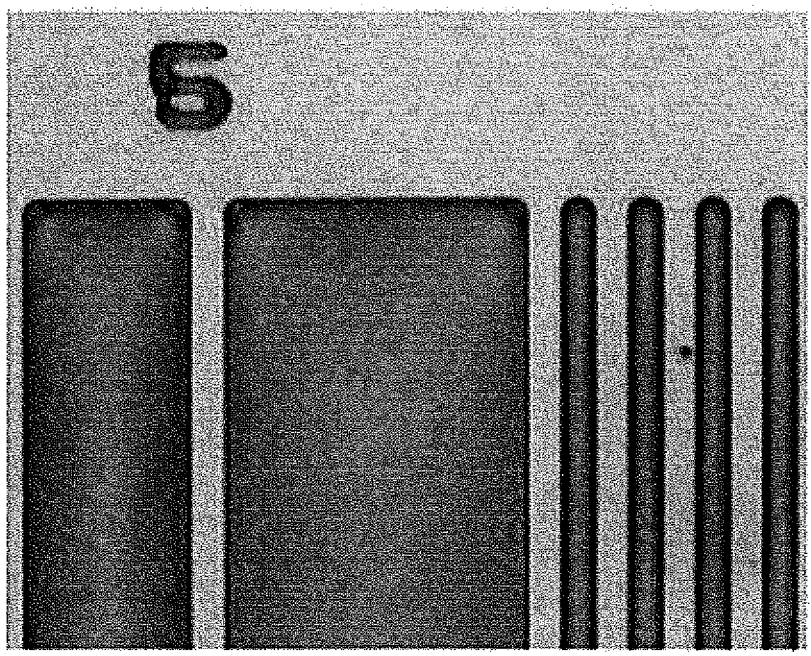
FIG. 2 is a photomicrograph of a 5 μm cured line and space (L/S) pattern and a 5 μm cured contact hole (C/H) pattern at 250° C., which were obtained in Example 5.

The photosensitive polysiloxane composition was applied onto a silicon wafer by a spin coating, followed by prebaking on a hot plate at 100° C. for 90 seconds to prepare a photosensitive film of 2 µm in thickness. After prebaking, the film was exposed at a dose of 130 mJ/cm² with a g- and h-lines exposure machine, Nikon FX-604 (NA=0.1) and then developed with a 2.38% TMAH aqueous solution, followed by rinsing with pure water. As a result, it was confirmed that 10 µm and 5 µm clear line and space (L/S) patterns and 10 pin and 5 µm clear contact hole (C/H) patterns, all of which have no residue, were formed. The patterns were full-exposed with Canon PLA-501F at a dose of 600 mJ/cm² and then cured by burning at 250° C. These 10 µm and 5 µm patterns were observed with an optical microscope. Microscopic photographs thereof were shown in FIGS. 1 and 2. As clear from FIG. 1 (10 µm pattern) and FIG. 2 (5 µm pattern), these patterns kept good shape though the edges thereof were rounded to some exert and the 10 or 5 µm patterns were kept. The dielectric constant thereof was 3.2.

Example 6

Positive Photosensitive Siloxane Composition 64 wt % of Polysiloxane Ia-2 and 36 wt % of Polysiloxane Ib-3 were mixed and the mixture was prepared to a 35% concentration solution using PGMEA. On measuring the dissolution rate of the polysiloxane mixture in a 2.38% aqueous TMAH solution, it was 340 Å/second. To the polysiloxane mixture, 12 wt % of PAC to the total amount of polysiloxanes were added. Further, 0.3 wt % of a surfactant, KF-53 manufactured by Shin-Etsu Chemical Co., Ltd. to the total amount of polysiloxanes were added thereto to prepare a photosensitive siloxane composition.

The photosensitive polysiloxane composition was applied onto a silicon wafer by a spin coating, followed by prebaking on a hot plate at 100° C. for 90 seconds to prepare a photosensitive film of 2 µm in thickness. After prebaking, the film was exposed at a dose of 140 mJ/cm² with a g- and h-lines exposure machine, Nikon FX-604 (NA=0.1) and then developed with a 2.38% TMAH aqueous solution, followed by rinsing with pure water. As a result, it was confirmed that 3 µm clear line and space (L/S) patterns and 3 µm clear contact hole (C/H) patterns, both of which have no residue, were formed. The patterns were full-exposed with Canon PLA-501F at a dose of 600 mJ/cm² and then cured by burning at 250° C. When observed with an optical microscope, it was found that the patterns kept good shape though the edges thereof were rounded to some exert and the 3 µm patterns were kept. The dielectric constant thereof was 3.3.

Example 7

Positive Photosensitive Siloxane Composition 65 wt % of Polysiloxane Ia-3 and 35 wt % of Polysiloxane Ib-1 were mixed and the mixture was prepared to a 35% concentration solution using PGMEA. On measuring the dissolution rate of the polysiloxane mixture in a 2.38% TMAH aqueous solution, it was 414 Å/second. To the polysiloxane mixture, 12 wt % of PAC to the total amount of polysiloxanes were added. Further, 0.3 wt % of a surfactant, KF-53 manufactured by Shin-Etsu Chemical Co., Ltd. to the total amount of polysiloxanes were added thereto to prepare a photosensitive siloxane composition.

The photosensitive polysiloxane composition was applied onto a silicon wafer by a spin coating, followed by prebaking on a hot plate at 100° C. for 90 seconds to prepare a photosensitive film of 2 μm in thickness. After prebaking, the film was exposed at a dose of 150 mJ/cm$^2$ with a g- and h-lines exposure machine, Nikon FX-604 (NA=0.1) and then developed with a 2.38% TMAH aqueous solution, followed by rinsing with pure water. As a result, it was confirmed that 5 μm clear line and space (L/S) patterns and 5 μm clear contact hole (C/H) patterns, both of which have no residue, were formed. The patterns were full-exposed with Canon PLA-501F at a dose of 600 mJ/cm$^2$ and then cured by burning at 250° C. When observed with an optical microscope, it was found that the patterns kept good shape though the edges thereof were rounded to some exert and the 5 μm patterns were kept. The dielectric constant thereof was 3.2.

Example 8

Positive Photosensitive Siloxane Composition 63 wt % of Polysiloxane Ia-3 and 37 wt % of Polysiloxane Ib-2 were mixed and the mixture was prepared to a 35% concentration solution using PGMEA. On measuring the dissolution rate of the polysiloxane mixture in a 2.38% TMAH aqueous solution, it was 313 Å/second. To the polysiloxane mixture, 12 wt % of PAC to the total amount of polysiloxanes were added. Further, 0.3 wt % of a surfactant, KF-53 manufactured by Shin-Etsu Chemical Co., Ltd. to the total amount of polysiloxanes were added thereto to prepare a photosensitive siloxane composition.

The photosensitive polysiloxane composition was applied onto a silicon wafer by a spin coating, followed by prebaking on a hot plate at 100° C. for 90 seconds to prepare a photosensitive film of 2 μm in thickness. After prebaking, the film was exposed at a dose of 140 mJ/cm$^2$ with a g- and h-lines exposure machine, Nikon FX-604 (NA=0.1) and then developed with a 2.38% TMAH aqueous solution, followed by rinsing with pure water. As a result, it was confirmed that 3 μm clear line and space (L/S) patterns and 3 μm clear contact hole (C/H) patterns, both of which have no residue, were formed. The patterns were full-exposed with Canon PLA-501F at a dose of 600 mJ/cm$^2$ and then cured by burning at 250° C. When observed with an optical microscope, it was found that the patterns kept good shape though the edges thereof were rounded to some exert and the 3 μm patterns was kept. The dielectric constant thereof was 3.2.

Example 9

Positive Photosensitive Siloxane Composition 60 wt % of Polysiloxane Ia-3 and 40 wt % of Polysiloxane Ib-3 were mixed and the mixture was prepared to a 35% concentration solution using PGMEA. On measuring the dissolution rate of the polysiloxane mixture in a 2.38% TMAH aqueous solution, it was 524 Å/second. To the polysiloxane mixture, 12 wt % of PAC to the total amount of polysiloxanes were added. Further, 0.3 wt % of a surfactant, KF-53 manufactured by Shin-Etsu Chemical Co., Ltd. to the total amount of polysiloxanes were added thereto to prepare a photosensitive siloxane composition.

The photosensitive polysiloxane composition was applied onto a silicon wafer by a spin coating, followed by prebaking on a hot plate at 100° C. for 90 seconds to prepare a photosensitive film of 2 μm in thickness. After prebaking, the film was exposed at a dose of 100 mJ/cm$^2$ with g- and h-lines exposure machine, Nikon FX-604 (NA=0.1) and then developed with a 2.38% TMAH aqueous solution, followed by rinsing with pure water. As a result, it was confirmed that 3 μm clear line and space (L/S) patterns and 3 μm clear contact hole (C/H) patterns, both of which have no residue, were formed. The patterns were full-exposed with Canon PLA-501F at a dose of 600 mJ/cm$^2$ and then cured by burning at 250° C. When observed with an optical microscope, it was found that the patterns kept good shape though the edges thereof were rounded to some exert and the 3 μm patterns were kept. The dielectric constant thereof was 3.3.

Example 10

Positive Photosensitive Siloxane Composition 40 wt % of Polysiloxane Ia-2 and 60 wt % of Polysiloxane Ib-4 were mixed and the mixture was prepared to a 35% concentration solution using PGMEA. On measuring the dissolution rate of the polysiloxane mixture in a 2.38% TMAH aqueous solution, it was 310 Å/second. To the polysiloxane mixture, 12 wt % of PAC to the total amount of polysiloxanes were added. Further, 0.3 wt % of a surfactant, KF-53 manufactured by Shin-Etsu Chemical Co., Ltd. to the total amount of polysiloxanes were added thereto to prepare a photosensitive siloxane composition.

The photosensitive polysiloxane composition was applied onto a silicon wafer by a spin coating, followed by prebaking on a hot plate at 100° C. for 90 seconds to prepare a photosensitive film of 2 μm in thickness. After prebaking, the film was exposed at a dose of 160 mJ/cm$^2$ with a g- and h-lines exposure machine, Nikon FX-604 (NA=0.1) and then developed with a 2.38% TMAH aqueous solution, followed by rinsing with pure water. As a result, it was confirmed that 5 μm clear line and space (L/S) patterns and 5 μm clear contact hole (C/H) patterns, both of which have no residue, were formed. The patterns were full-exposed with Canon PLA-501F at a dose of 600 mJ/cm$^2$ and then cured by burning at 250° C.

When observed with an optical microscope, it was found that the patterns kept good shape though the edges thereof were rounded to some exert and the 5 μm patterns was kept. The dielectric constant thereof was 3.2.

Example 11

Positive Photosensitive Siloxane Composition 55 wt % of Polysiloxane Ia-2 and 45 wt % of Polysiloxane Ib-4 were mixed and the mixture was prepared to a 35% concentration solution using PGMEA. On measuring the dissolution rate of the polysiloxane mixture in a 2.38% TMAH aqueous solution, it was 259 Å/second. To the polysiloxane mixture, 12 wt % of PAC to the total amount of polysiloxanes were added. Further, 0.3 wt % of a surfactant, KF-53 manufactured by Shin-Etsu Chemical Co., Ltd. to the total amount of polysiloxanes were added thereto to prepare a photosensitive siloxane composition.

The photosensitive polysiloxane composition was applied onto a silicon wafer by a spin coating, followed by prebaking on a hot plate at 100° C. for 90 seconds to prepare a photosensitive film of 0.5 μm in thickness. After prebaking, the film was exposed at a dose of 270 mJ/cm$^2$ with a g- and h-lines exposure machine, Nikon FX-604 (NA=0.1) and then developed with a 2.38% TMAH aqueous solution, followed by rinsing with pure water. As a result, it was confirmed that 5 μm clear line and space (L/S) patterns and 5 μm clear contact hole (C/H) patterns, both of which have no residue, were formed. The patterns were full-exposed with Canon PLA-501F at a dose of 600 mJ/cm$^2$ and then cured by burning at 250° C. When observed with an optical microscope, it was found that the patterns kept good shape though the edges thereof were rounded to some exert and the 5 μm patterns were kept. The dielectric constant thereof was 3.2.

Example 12

Positive Photosensitive Siloxane Composition 25 wt % of Polysiloxane Ia-2 and 75 wt % of Polysiloxane Ib-5 were mixed and the mixture was prepared to a 35% concentration solution using PGMEA. On measuring the dissolution rate of the polysiloxane mixture in a 2.38% TMAH aqueous solution, it was 158 Å/second. To the polysiloxane mixture, 12 wt % of PAC to the total amount of polysiloxanes were added. Further, 0.3 wt % of a surfactant, KF-53 manufactured by Shin-Etsu Chemical Co., Ltd. to the total amount of polysiloxanes were added thereto to prepare a photosensitive siloxane composition.

The photosensitive polysiloxane composition was applied onto a silicon wafer by a spin coating, followed by prebaking on a hot plate at 100° C. for 90 seconds to prepare a photosensitive film of 0.2 μm in thickness. After prebaking, the film was exposed at a dose of 220 mJ/cm$^2$ with a g- and h-lines exposure machine, Nikon FX-604 (NA=0.1) and then developed with a 2.38% TMAH aqueous solution, followed by rinsing with pure water. As a result, it was confirmed that 5 μm clear line and space (L/S) patterns and 5 μm clear contact hole (C/H) patterns, both of which have no residue, were formed. The patterns were full-exposed with Canon PLA-501F at a dose of 600 mJ/cm$^2$ and then cured by burning at 250° C. When observed with an optical microscope, it was found that the patterns kept good shape though the edges thereof were rounded to some exert and the 5 μm patterns were kept. The dielectric constant thereof was 3.3.

Example 13

Positive Photosensitive Siloxane Composition 30 wt % of Polysiloxane Ia-2 and 70 wt % of Polysiloxane Ib-6 were mixed and the mixture was prepared to a 35% concentration solution using PGMEA. On measuring the dissolution rate of the polysiloxane mixture in a 2.38% TMAH aqueous solution, it was 294 Å/second. To the polysiloxane mixture, 12 wt % of PAC to the total amount of polysiloxanes were added. Further, 0.3 wt % of a surfactant, KF-53 manufactured by Shin-Etsu Chemical Co., Ltd. to the total amount of polysiloxanes were added thereto to prepare a photosensitive siloxane composition.

The photosensitive polysiloxane composition was applied onto a silicon wafer by a spin coating, followed by prebaking on a hot plate at 100° C. for 90 seconds to prepare a photosensitive film of 0.5 μm in thickness. After prebaking, the film was exposed at a dose of 160 mJ/cm$^2$ with a g- and h-lines exposure machine, Nikon FX-604 (NA=0.1) and then developed with a 2.38% TMAH aqueous solution, followed by rinsing with pure water. As a result, it was confirmed that 5 μm clear line and space (L/S) patterns and 5 μm clear contact hole (C/H) patterns, both of which have no residue, were formed. The patterns were full-exposed with Canon PLA-501F at a dose of 600 mJ/cm$^2$ and then cured by burning at 250° C. When observed with an optical microscope, it was found that the patterns kept good shape though the edges thereof were rounded to some exert and the 5 μm patterns were kept. The dielectric constant thereof was 3.2.

Example 14

Positive Photosensitive Siloxane Composition 32 wt % of Polysiloxane Ia-2 and 68 wt % of Polysiloxane Ib-7 were mixed and the mixture was prepared to a 35% concentration solution using PGMEA. On measuring the dissolution rate of the polysiloxane mixture in a 2.38% TMAH aqueous solution, it was 302 Å/second. To the polysiloxane mixture, 12 wt % of PAC to the total amount of polysiloxanes were added. Further, 0.3 wt % of a surfactant, KF-53 manufactured by Shin-Etsu Chemical Co., Ltd. to the total amount of polysiloxanes were added thereto to prepare a photosensitive siloxane composition.

The photosensitive polysiloxane composition was applied onto a silicon wafer by a spin coating, followed by prebaking on a hot plate at 100° C. for 90 seconds to prepare a photosensitive film of 0.5 μm in thickness. After prebaking, the film was exposed at a dose of 160 mJ/cm$^2$ with a g- and h-lines exposure machine, Nikon FX-604 (NA=0.1) and then developed with a 2.38% TMAH aqueous solution, followed by rinsing with pure water. As a result, it was confirmed that 5 μm clear line and space (L/S) patterns and 5 μm clear contact hole (C/H) patterns, both of which have no residue, were formed. The patterns were full-exposed with Canon PLA-501F at a dose of 600 mJ/cm$^2$ and then cured by burning at 250° C. When observed with an optical microscope, it was found that the patterns kept good shape though the edges thereof were rounded to some exert and the 5 μm patterns were kept. The dielectric constant thereof was 3.2.

Example 15

Positive Photosensitive Siloxane Composition 20 wt % of Polysiloxane Ia-2 and 80 wt % of Polysiloxane Ib-8 were mixed and the mixture was prepared to a 35% concentration solution using PGMEA. On measuring the dissolution rate of the polysiloxane mixture in a 2.38% TMAH aqueous solution, it was 51 Å/second. To the polysiloxane mixture, 12 wt % of PAC to the total amount of polysiloxanes were added. Further, 0.3 wt % of a surfactant, KF-53 manufactured by Shin-Etsu Chemical Co., Ltd. to the total amount of polysiloxanes were added thereto to prepare a photosensitive siloxane composition.

The photosensitive polysiloxane composition was applied onto a silicon wafer by a spin coating, followed by prebaking on a hot plate at 100° C. for 90 seconds to prepare a photosensitive film of 0.1 μm in thickness. After prebaking, the film was exposed at a dose of 120 mJ/cm$^2$ with a g- and h-lines exposure machine, Nikon FX-604 (NA=0.1) and then developed with a 2.38% TMAH aqueous solution, followed by rinsing with pure water. As a result, it was confirmed that 10 μm clear line and space (L/S) patterns and 10 μm clear contact hole (C/H) patterns, both of which have no residue, were formed. The patterns were full-exposed with Canon PLA-501F at a dose of 600 mJ/cm² and then cured by burning at 250° C. When observed with an optical microscope, it was found that the patterns kept good shape though the edges thereof were rounded to some exert and the 10 μm patterns were kept. The dielectric constant thereof was 3.1.

Example 16

Positive Photosensitive Siloxane Composition 70 wt % of Polysiloxane Ia-2 and 30 wt % of Polysiloxane Ib-4 were mixed and the mixture was prepared to a 35% concentration solution using PGMEA. On measuring the dissolution rate of the polysiloxane mixture in a 2.38% TMAH aqueous solution, it was 15 Å/second. To the polysiloxane mixture, 12 wt % of PAC to the total amount of polysiloxanes were added. Further, 0.8 wt % of a photo base generator, NBC-101 manufactured by Midori Kagaku Co., Ltd. to the total amount of polysiloxanes and 0.3 wt % of a surfactant, KF-53 manufactured by Shin-Etsu Chemical Co., Ltd. to the total amount of polysiloxanes were added thereto to prepare a photosensitive siloxane composition.

The photosensitive polysiloxane composition was applied onto a silicon wafer by a spin coating, followed by prebaking on a hot plate at 100° C. for 90 seconds to prepare a photosensitive film of 0.1 μm in thickness. After prebaking, the film was exposed at a dose of 180 mJ/cm² with a g- and h-lines exposure machine, Nikon FX-604 (NA=0.1) and then developed with a 2.38% TMAH aqueous solution, followed by rinsing with pure water. As a result, it was confirmed that 5 μm clear line and space (L/S) patterns and 5 μm clear contact hole (C/H) patterns, both of which have no residue, were formed. The patterns were full-exposed with Canon. PLA-501F at a dose of 600 mJ/cm² and then cured by burning at 250° C. When observed with an optical microscope, it was found that the patterns kept good shape though the edges thereof were rounded to some exert and the 5 μm patterns were kept. The dielectric constant thereof was 3.2.

Example 17

Positive Photosensitive Siloxane Composition 40 wt % of Polysiloxane Ia-2 and 60 wt % of Polysiloxane Ib-2 were mixed and the mixture was prepared to a 35% concentration solution using PGMEA. On measuring the dissolution rate of the polysiloxane mixture in a 2.38% TMAH aqueous solution, it was 723 Å/second. To the polysiloxane mixture, 12 wt % of PAC to the total amount of polysiloxanes were added. Further, 1.5 wt % of a photo acid generator, PAI-1001 manufactured by Midori Kagaku Co., Ltd. to the total amount of polysiloxanes and 0.3 wt % of a surfactant, KF-53 manufactured by Shin-Etsu Chemical Co., Ltd. to the total amount of polysiloxanes were added thereto to prepare a photosensitive siloxane composition.

The photosensitive polysiloxane composition was applied onto a silicon wafer by a spin coating, followed by prebaking on a hot plate at 100° C. for 90 seconds to prepare a photosensitive film of 5 μm in thickness. After prebaking, the film was exposed at a dose of 190 mJ/cm² with a g- and h-lines exposure machine, Nikon FX-604 (NA=0.1) and then developed with a 2.38% TMAH aqueous solution, followed by rinsing with pure water. As a result, it was confirmed that 3 μm clear line and space (L/S) patterns and 3 μm clear contact hole (C/H) patterns, both of which have no residue, were formed. The patterns were full-exposed with Canon PLA-501F at a dose of 600 mJ/cm² and then cured by burning at 250° C. When observed with an optical microscope, it was found that the patterns kept good shape though the edges thereof were rounded to some exert and the 3 μm patterns were kept. The dielectric constant thereof was 3.2.

Example 18

Positive Photosensitive Siloxane Composition 40 wt % of Polysiloxane Ia-2 and 60 wt % of Polysiloxane Ib-2 were mixed and the mixture was prepared to a 35% concentration solution using PGMEA. On measuring the dissolution rate of the polysiloxane mixture in a 2.38% TMAH aqueous solution, it was 723 Å/second. To the polysiloxane mixture, 12 wt % of PAC to the total amount of polysiloxanes were added. Further, 1.5 wt % of a photo acid generator, PAI-1001 manufactured by Midori Kagaku Co., Ltd. to the total amount of polysiloxanes and 0.3 wt % of a surfactant, KF-53 manufactured by Shin-Etsu Chemical Co., Ltd. to the total amount of polysiloxanes were added thereto to prepare a photosensitive siloxane composition.

The photosensitive polysiloxane composition was applied onto a silicon wafer by a spin coating, followed by prebaking on a hot plate at 100° C. for 90 seconds to prepare a photosensitive film of 5 μm in thickness. After prebaking, the film was exposed at a dose of 250 mJ/cm² with a g- and h-lines exposure machine, Nikon FX-604 (NA=0.1) and then developed with a 2.38% THAN aqueous solution, followed by rinsing with pure water. As a result, it was confirmed that 3 μm clear line and space (L/S) patterns and 3 μm clear contact hole (C/H) patterns, both of which have no residue, were formed. The patterns were full-exposed with Canon PLA-501F at a dose of 600 mJ/cm² and then cured by burning at 250° C. When observed with an optical microscope, it was found that the patterns kept good shape though the edges thereof were rounded to some exert and the 3 μm patterns were kept. The dielectric constant thereof was 3.1.

Example 19

Positive Photosensitive Siloxane Composition 40 wt % of Polysiloxane Ia-2 and 60 wt % of Polysiloxane Ib-2 were mixed and the mixture was prepared to a 35% concentration solution using PGMEA. On measuring the dissolution rate of the polysiloxane mixture in a 2.38% TMAH aqueous solution, it was 723 Å/second. To the polysiloxane mixture, 12 wt % of PAC to the total amount of polysiloxanes were added. Further, 1.5 wt % of a photo acid generator, triphenylsulfonium trifluoromethane sulfonate manufactured by Sigma-Aldrich Japan Co. to the total amount of polysiloxanes and 0.3 wt % of a surfactant, KF-53 manufactured by Shin-Etsu Chemical Co., Ltd. to the total amount of polysiloxanes were added thereto to prepare a photosensitive siloxane composition.

The photosensitive polysiloxane composition was applied onto a silicon wafer by a spin coating, followed by prebaking on a hot plate at 100° C. for 90 seconds to prepare a photosensitive film of 3 μm in thickness. After prebaking, the film was exposed at a dose of 140 mJ/cm² with a g- and h-lines exposure machine, Nikon FX-604 (NA=0.1) and then developed with a 2.38% TMAH aqueous solution, followed by rinsing with pure water. As a result, it was confirmed that 5 μm clear line and space (L/S) patterns and 5 μm clear contact hole (C/H) patterns, both of which have no residue, were formed. The patterns were full-exposed with Canon PLA-501F at a dose of 600 mJ/cm² and then cured by burning at 250° C. When observed with an optical microscope, it was found that the patterns kept good shape though the edges thereof were rounded to some exert and the 5 μm patterns were kept. The dielectric constant thereof was 3.1.

Example 20

Positive Photosensitive Siloxane Composition 60 wt % of Polysiloxane Ia-2 and 40 wt % of Polysiloxane Ib-1 were mixed and the mixture was prepared to a 35% concentration solution using PGMEA. On measuring the dissolution rate of the polysiloxane mixture in a 2.38% TMAH aqueous solution, it was 362 Å/second. To the polysiloxane mixture, 12 wt % of PAC to the total amount of polysiloxanes were added. Further, 0.5 wt % of a photo base generator, NBC-101 manufactured by Midori Kagaku Co., Ltd. to the total amount of polysiloxanes and 0.3 wt % of a surfactant, KF-53 manufactured by Shin-Etsu Chemical Co., Ltd. to the total amount of polysiloxanes were added thereto to prepare a photosensitive siloxane composition.

The photosensitive polysiloxane composition was applied onto a silicon wafer by a spin coating, followed by prebaking on a hot plate at 100° C. for 90 seconds to prepare a photosensitive film of 2 μm in thickness. After prebaking, the film was exposed at a dose of 170 mJ/cm² with a g- and h-lines exposure machine, Nikon FX-604 (NA=0.1) and then developed with a 2.38% TMAH aqueous solution, followed by rinsing with pure water. As a result, it was confirmed that 3 μm clear line and space (L/S) patterns and 3 μm clear contact hole (C/H) patterns, both of which have no residue, were formed. The patterns were full-exposed with Canon PLA-501F at a dose of 600 mJ/cm² and then cured by burning at 250° C. When observed with an optical microscope, it was found that the patterns kept good shape though the edges thereof were rounded to some exert and the 3 patterns were kept. The dielectric constant thereof was 3.2.

Example 21

Positive Photosensitive Siloxane Composition 53 wt % of Polysiloxane Ia-2 and 47 wt % of Polysiloxane Ib-2 were mixed and the mixture was prepared to a 35% concentration solution using PGMEA. On measuring the dissolution rate of the polysiloxane mixture in a 2.38% TMAH aqueous solution, it was 423 Å/second. To the polysiloxane mixture, 12 wt % of PAC to the total amount of polysiloxanes were added. Further, 1.2 wt % of a photo acid generator, PAI-1001 manufactured by Midori Kagaku Co., Ltd. to the total amount of polysiloxanes and 0.3 wt % of a surfactant, KF-53 manufactured by Shin-Etsu Chemical Co., Ltd. to the total amount of polysiloxanes were added thereto to prepare a photosensitive siloxane composition.

The photosensitive polysiloxane composition was applied onto a silicon wafer by a spin coating, followed by prebaking on a hot plate at 100° C. for 90 seconds to prepare a photosensitive film of 2 μm in thickness. After prebaking, the film was exposed at a dose of 125 mJ/cm² with a g- and h-lines exposure machine, Nikon FX-604 (NA=0.1) and then developed with a 2.38% TMAH aqueous solution, followed by rinsing with pure water. As a result, it was confirmed that 4 μm clear line and space (L/S) patterns and 4 μm clear contact hole (C/H) patterns, both of which have no residue, were formed. The patterns were full-exposed with Canon PLA-501F at a dose of 600 mJ/cm² and then cured by burning at 250° C. When observed with an optical microscope, it was found that the patterns kept good shape though the edges thereof were rounded to some exert and the 4 μm patterns were kept. The dielectric constant thereof was 3.2.

Example 22

Positive Photosensitive Siloxane Composition 53 wt % of Polysiloxane Ia-2 and 47 wt % of Polysiloxane Ib-2 were mixed and the mixture was prepared to a 35% concentration solution using PGMEA. On measuring the dissolution rate of the polysiloxane mixture in a 2.38% TMAH aqueous solution, it was 604 Å/second. To the polysiloxane mixture, 12 wt % of PAC to the total amount of polysiloxanes were added. Further, 2.0 wt % of a photo acid generator, triphenylsulfonium trifluoromethane sulfonate manufactured by Sigma-Aldrich Japan Co. to the total amount of polysiloxanes and 0.3 wt % of a surfactant, KF-53 manufactured by Shin-Etsu Chemical Co., Ltd. to the total amount of polysiloxanes were added thereto to prepare a photosensitive siloxane composition.

The photosensitive polysiloxane composition was applied onto a silicon wafer by a spin coating, followed by prebaking on a hot plate at 100° C. for 90 seconds to prepare a photosensitive film of 2 μm in thickness. After prebaking, the film was exposed at a dose of 120 mJ/cm² with a g- and h-lines exposure machine, Nikon FX-604 (NA=0.1) and then developed with a 2.38% TMAH aqueous solution, followed by rinsing with pure water. As a result, it was confirmed that 3 μm clear line and space (L/S) patterns and 3 μm clear contact hole (C/H) patterns, both of which have no residue, were formed. The patterns were full-exposed with Canon PLA-501F at a dose of 600 mJ/cm² and then cured by burning at 250° C. When observed with an optical microscope, it was found that the patterns kept good shape though the edges thereof were rounded to some exert and the 3 μm patterns were kept. The dielectric constant thereof was 3.2.

Example 23

Positive Photosensitive Siloxane Composition

A photosensitive composition, which was obtained by further adding 1 wt % of 15-crown-5-ether manufactured by Tokyo Chemical Industry Co., Ltd. to the total amount of polysiloxanes to the composition of Example 11, was prepared. The photosensitive polysiloxane composition was applied onto a silicon wafer by a spin coating, followed by prebaking on a hot plate at 100° C. for 90 seconds to prepare a photosensitive film of 0.5 μm in thickness. After prebaking, the film was exposed with a g- and h-lines exposure machine, Nikon FX-604 (NA=0.1). The optimum exposure thereof was 210 mJ/cm². As the optimum exposure of the Example 11 composition was 270 mJ/cm², the sensitivity of Example 23 composition became higher by addition of 15-crown-5-ether. The exposed film was then developed with a 2.38% TMAH aqueous solution, followed by rinsing with pure water. As a result, it was confirmed that 3 μm clear line and space (L/S) patterns and 3 μm clear contact hole (C/H) patterns, both of which have no residue, were formed. The patterns were full-exposed with Canon PLA-501F at a dose of 600 mJ/cm² and then cured by burning at 250° C. When observed with an optical microscope, it was found that the patterns kept good shape though the edges thereof were rounded to some exert and the 3 μm patterns were kept. The dielectric constant thereof was 3.2.

Example 24

Positive Photosensitive Siloxane Composition

A photosensitive composition, which was obtained by further adding 1 wt % of 18-crown-6-ether manufactured by Tokyo Chemical Industry Co., Ltd. to the total amount of polysiloxanes to the composition of Example 14, was prepared. The photosensitive polysiloxane composition was applied onto a silicon wafer by a spin coating, followed by prebaking on a hot plate at 100° C. for 90 seconds to prepare a photosensitive film of 0.5 μm in thickness. After prebaking, the film was exposed with a g- and h-lines exposure machine, Nikon FX-604 (NA=0.1). The optimum exposure thereof was 135 mJ/cm$^2$. As the optimum exposure of the Example 14 composition was 160 mJ/cm$^2$, the sensitivity of Example 24 composition became higher by addition of 18-crown-6-ether. The exposed composition was then developed with a 2.38% TMAH aqueous solution, followed by rinsing with pure water. As a result, it was confirmed that 3 μm clear line and space (L/S) patterns and 3 μm clear contact hole (C/H) patterns, both of which have no residue, were formed. The patterns were full-exposed with Canon PLA-501F at a dose of 600 mJ/cm$^2$ and then cured by burning at 250° C. When observed with an optical microscope, it was found that the patterns kept good shape though the edges thereof were rounded to some exert and the 3 μm patterns were kept. The dielectric constant thereof was 3.2.

Comparative Example 1

40 wt % of Comparison 1 polysiloxane and 60 wt % of Polysiloxane Ib-2 were mixed and the mixture was prepared to a 35% concentration solution using PGMEA. On measuring the dissolution rate of the polysiloxane mixture in a 2.38% aqueous TMAH solution, it was 399 Å/second. To the polysiloxane mixture, 12 wt % of PAC to the total amount of polysiloxanes were added. Further, 0.3 wt % of a surfactant, KF-53 manufactured by Shin-Etsu Chemical Co., Ltd. to the total amount of polysiloxanes were added thereto to prepare a photosensitive siloxane composition.

The photosensitive polysiloxane composition was applied onto a silicon wafer by a spin coating, followed by prebaking on a hot plate at 100° C. for 90 seconds to prepare a photosensitive film of 2 μm in thickness. After prebaking, the film was exposed at a dose of 85 mJ/cm$^2$ with a g- and h-lines exposure machine, Nikon FX-604 (NA=0.1) and then developed with a 2.38% TMAH aqueous solution, followed by rinsing with pure water. As a result, it was confirmed that 10 μm clear line and space (L/S) patterns and 10 μm clear contact hole (C/H) patterns, both of which have no residue, were formed. The patterns were full-exposed with Canon PLA-501F at a dose of 600 mJ/cm$^2$ and then cured by burning at 250° C. When observed with an optical microscope, it was found that the 10 μm patterns did not keep their original shapes by a thermal sagging. The dielectric constant thereof was 3.1.

Comparative Example 2

75 wt % of Comparison 2 polysiloxane and 25 wt % of Polysiloxane Ib-2 were mixed and the mixture was prepared to a 35% concentration solution using PGMEA. On measuring the dissolution rate of the polysiloxane mixture in a 2.38% aqueous TMAH solution, it was 362 Å/second. To the polysiloxane mixture, 12 wt % of PAC to the total amount of polysiloxanes were added. Further, 0.3 wt % of a surfactant, KF-53 manufactured by Shin-Etsu Chemical Co., Ltd. to the total amount of polysiloxanes were added thereto to prepare a photosensitive siloxane composition.

The photosensitive polysiloxane composition was applied onto a silicon wafer by a spin coating method, followed by prebaking it on a hot plate at 100° C. for 90 seconds to prepare a photosensitive film of 2 μm in thickness. After prebaking, the film was exposed at a dose of 180 mJ/cm$^2$ with a g- and h-lines exposure machine, Nikon FX-604 (NA=0.1) and then developed with a 2.38% TMAH aqueous solution, followed by rinsing with pure water. As a result, it was confirmed that 10 μm clear line and space (L/S) patterns and 10 μm clear contact hole (C/H) patterns, both of which have no residue, were formed. The patterns were full-exposed with Canon PLA-501F at a dose of 600 mJ/cm$^2$ and then cured by burning at 250° C. When the patterns formed were observed with an optical microscope, the 10 μm patterns did not keep their original shapes by a thermal sagging. The dielectric constant thereof was 3.1.

Comparative Example 3

70 wt % of Comparison 3 polysiloxane and 30 wt % of Polysiloxane Ib-2 were mixed and the mixture was prepared to a 35% concentration solution using PGMEA. On measuring the dissolution rate of the polysiloxane mixture in a 2.38% aqueous TMAH solution, it was 356 Å/second. To the polysiloxane mixture, 12 wt % of PAC to the total amount of polysiloxanes were added. Further, 0.3 wt % of a surfactant, KF-53 manufactured by Shin-Etsu Chemical Co., Ltd. to the total amount of polysiloxanes were added thereto to prepare a photosensitive siloxane composition.

Figure 3:
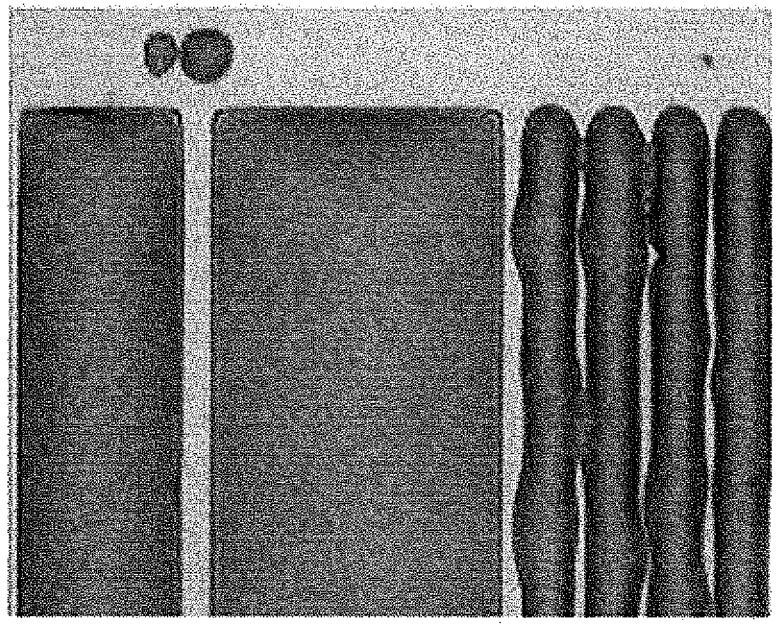
FIG. 3 is a photomicrograph of a 10 μm cured line and space (L/S) pattern and a 10 μm cured contact hole (C/H) pattern at 250° C., which were obtained in Comparative Example 3.
Figure 4:
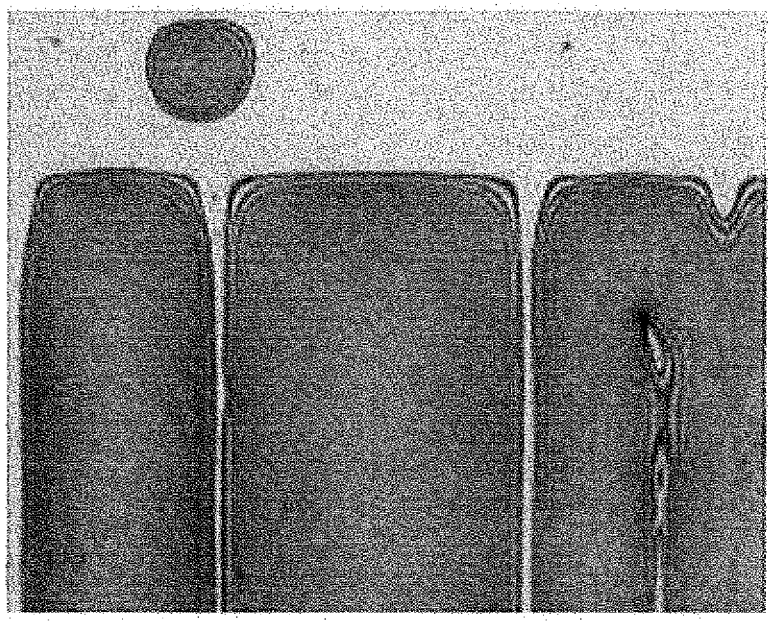
FIG. 4 is a photomicrograph of a 5 μm cured line and space (L/S) pattern and a 5 μm cured contact hole (C/H) pattern at 250° C., which were obtained in Comparative Example 3.

The photosensitive polysiloxane composition was applied onto a silicon wafer by a spin coating, followed by prebaking on a hot plate at 100° C. for 90 seconds to prepare a photosensitive film of 2 μm in thickness. After prebaking, the film was exposed at a dose of 190 mJ/cm$^2$ with a g- and h-lines exposure machine, Nikon FX-604 (NA=0.1) and then developed with a 2.38% TMAH aqueous solution, followed by rinsing with pure water. As a result, it was confirmed that 5 μm and 10 μm clear line and space (L/S) patterns and 5 μm and 10 μm clear contact hole (C/H) patterns, all of which have no residue, were formed. The patterns were full-exposed with Canon PLA-501F at a dose of 600 mJ/cm$^2$ and then cured by burning at 250° C. Microscopic photographs thereof were shown in FIGS. 3 and 4. As clear from FIG. 3 (10 μm pattern) and FIG. 4 (5 μm pattern), all of the 10 μm and 5 μm patterns do not keep their original shapes by a thermal sagging. The dielectric constant thereof was 3.2.

Comparative Example 4

40 wt % of Comparison 2 polysiloxane and 60 wt % of Polysiloxane Ib-6 were mixed and the mixture was prepared to a 35% concentration solution using PGMEA. On measuring the dissolution rate of the polysiloxane mixture in a 2.38% aqueous TMAH solution, it was 225 Å/second. To the polysiloxane mixture, 12 wt % of PAC to the total amount of polysiloxanes were added. Further, 0.3 wt % of a surfactant, KF-53 manufactured by Shin-Etsu Chemical Co., Ltd. to the total amount of polysiloxanes were added thereto to prepare a photosensitive siloxane composition.

The photosensitive polysiloxane composition was applied onto a silicon wafer by a spin coating, followed by prebaking on a hot plate at 100° C. for 90 seconds to prepare a photosensitive film of 0.5 μm in thickness. After prebaking, the film was exposed at a dose of 140 mJ/cm$^2$ with a g- and h-lines exposure machine, Nikon FX-604 (NA=0.1) and then developed with a 2.38% TMAH aqueous solution, followed by rinsing with pure water. As a result, it was confirmed that 10 μm clear line and space (L/S) patterns and 10 μm clear contact hole (C/H) patterns, both of which have no residue, were formed. The patterns were full-exposed with Canon PLA-501F at a dose of 600 mJ/cm$^2$ and then cured by burning at 250° C. When observed with an optical microscope, it was found that the μm patterns did not keep their original shapes by a thermal sagging. The dielectric constant thereof was 3.2.

Comparative Example 5

Positive Photosensitive Siloxane Composition 30 wt % of Polysiloxane Ia-1 and 70 wt % of Polysiloxane Ib-3 were mixed and the mixture was prepared to a 35% concentration solution using PGMEA. On measuring the dissolution rate of the polysiloxane mixture in a 2.38% aqueous TMAH solution, it was 1,220 Å/second. To the polysiloxane mixture, 12 wt % of PAC to the total amount of polysiloxanes were added. Further, 1.5 wt % of a photo acid generator, triphenylsulfonium trifluoromethane sulfonate manufactured by Sigma-Aldrich Japan Co. to the total amount of polysiloxanes and 0.3 wt % of a surfactant, KF-53 manufactured by Shin-Etsu Chemical Co., Ltd. to the total amount of polysiloxanes were added thereto to prepare a photosensitive siloxane composition.

The photosensitive polysiloxane composition was applied onto a silicon wafer by a spin coating, followed by prebaking on a hot plate at 100° C. for 90 seconds to prepare a photosensitive film of 2 μm in thickness. After prebaking, the film was exposed at a dose of 30 mJ/cm$^2$ with a g- and h-lines exposure machine, Nikon FX-604 (NA=0.1) and then developed with a 2.38% TMAH aqueous solution, followed by rinsing with pure water. As a result, it was confirmed that 10 μm clear line and space (L/S) patterns and 10 μm clear contact hole (C/H) patterns, both of which have no residue, were formed. The patterns were full-exposed with Canon PLA-501F at a dose of 600 mJ/cm$^2$ and then cured by burning at 250° C. When observed with an optical microscope, it was found that the μm patterns did not keep their original shapes by the thermal sagging and the final residual layer thickness was less than 50%. The dielectric constant thereof was 3.1.

Comparative Example 6

Positive Photosensitive Siloxane Composition 90 wt % of Polysiloxane Ia-3 and 10 wt % of Polysiloxane Ib-6 were mixed and the mixture was prepared to a 35% concentration solution using PGMEA. On measuring the dissolution rate of the polysiloxane mixture in a 2.38% aqueous TMAH solution, it was 2 Å/second. To the polysiloxane mixture, 12 wt % of PAC to the total amount of polysiloxanes were added. Further, 1.5 wt % of a photo acid generator, triphenylsulfonium trifluoromethane sulfonate manufactured by Sigma-Aldrich Japan Co. to the total amount of polysiloxanes and 0.3 wt % of a surfactant, KF-53 manufactured by Shin-Etsu Chemical Co., Ltd. to the total amount of polysiloxanes were added thereto to prepare a photosensitive siloxane composition.

The photosensitive polysiloxane composition was applied onto a silicon wafer by a spin coating, followed by prebaking on a hot plate at 100° C. for 90 seconds to prepare a photosensitive film of 2 μm in thickness. After prebaking, the film was exposed at a dose of 500 mJ/cm$^2$ or more with a g- and h-lines exposure machine, Nikon FX-604 (NA=0.1) and then developed with a 2.38% TMAH aqueous solution, followed by rinsing with pure water. As a result, no pattern was formed.

Aforementioned positive photosensitive siloxane compositions of Examples 1 to 24 and siloxane compositions of Comparative Examples 1 to 6 are summarized in Tables 2.

TABLE 2

| Example | Ia (parts) | Ib (parts) | Dissolution rate of mixture (Å/sec.) | Sensitivity (EO) | Curing aide etc. | Dielectric constant | Thermal sagging of pattern | Film thickness |
|---|---|---|---|---|---|---|---|---|
| Example 1 | Ia-1 (80) | Ib-1 (20) | 137 | 220 mJ/cm$^2$ | none | 3.1 | 10 μm OK | 2.0 μm |
| Example 2 | Ia-1 (75) | Ib-2 (25) | 252 | 170 mJ/cm$^2$ | none | 3.1 | 5 μm OK | 2.0 μm |
| Example 3 | Ia-1 (70) | Ib-3 (30) | 487 | 130 mJ/cm$^2$ | none | 3.1 | 5 μm OK | 2.0 μm |
| Example 4 | Ia-2 (70) | Ib-1 (30) | 229 | 170 mJ/cm$^2$ | none | 3.2 | 5 μm OK | 2.0 μm |
| Example 5 | Ia-2 (66) | Ib-2 (34) | 383 | 130 mJ/cm$^2$ | none | 3.2 | 5 μm OK | 2.0 μm |
| Example 6 | Ia-2 (64) | Ib-3 (36) | 340 | 140 mJ/cm$^2$ | none | 3.3 | 3 μm OK | 2.0 μm |
| Example 7 | Ia-3 (65) | Ib-1 (35) | 414 | 150 mJ/cm$^2$ | none | 3.2 | 5 μm OK | 2.0 μm |
| Example 8 | Ia-3 (63) | Ib-2 (37) | 313 | 140 mJ/cm$^2$ | none | 3.2 | 3 μm OK | 2.0 μm |
| Example 9 | Ia-3 (60) | Ib-3 (40) | 524 | 100 mJ/cm$^2$ | none | 3.3 | 3 μm OK | 2.0 μm |
| Example 10 | Ia-2 (40) | Ib-4 (60) | 310 | 160 mJ/cm$^2$ | none | 3.2 | 5 μm OK | 2.0 μm |
| Example 11 | Ia-2 (55) | Ib-4 (45) | 259 | 270 mJ/cm$^2$ | none | 3.2 | 5 μm OK | 0.5 μm |
| Example 12 | Ia-2 (25) | Ib-5 (75) | 158 | 220 mJ/cm$^2$ | none | 3.3 | 5 μm OK | 0.2 μm |
| Example 13 | Ia-2 (30) | Ib-6 (70) | 294 | 160 mJ/cm$^2$ | none | 3.2 | 5 μm OK | 0.5 μm |
| Example 14 | Ia-2 (32) | Ib-7 (68) | 302 | 160 mJ/cm$^2$ | none | 3.2 | 5 μm OK | 0.5 μm |
| Example 15 | Ia-2 (20) | Ib-8 (80) | 51 | 120 mJ/cm$^2$ | none | 3.1 | 10 μm OK | 0.1 μm |
| Example 16 | Ia-2 (70) | Ib-4 (30) | 15 | 180 mJ/cm$^2$ | Base | 3.2 | 5 μm OK | 0.1 μm |
| Example 17 | Ia-2 (40) | Ib-2 (60) | 723 | 190 mJ/cm$^2$ | Acid | 3.2 | 3 μm OK | 5.0 μm |
| Example 18 | Ia-2 (40) | Ib-2 (60) | 723 | 250 mJ/cm$^2$ | Acid | 3.1 | 3 μm OK | 5.0 μm |
| Example 19 | Ia-2 (40) | Ib-2 (60) | 723 | 140 mJ/cm$^2$ | Acid | 3.1 | 5 μm OK | 3.0 μm |
| Example 20 | Ia-2 (60) | Ib-1 (40) | 362 | 170 mJ/cm$^2$ | Base | 3.2 | 3 μm OK | 2.0 μm |
| Example 21 | Ia-2 (53) | Ib-2 (47) | 423 | 125 mJ/cm$^2$ | Acid | 3.2 | 4 μm OK | 2.0 μm |
| Example 22 | Ia-2 (53) | Ib-2 (47) | 604 | 120 mJ/cm$^2$ | Acid | 3.2 | 3 μm OK | 2.0 μm |
| Example 23 | Ia-2 (55) | Ib-4 (45) | 259 | 210 mJ/cm$^2$ | 15-crown-5-ether | 3.2 | 3 μm OK | 0.5 μm |

TABLE 2-continued

| Example | Ia (parts) | Ib (parts) | Dissolution rate of mixture (Å/sec.) | Sensitivity (EO) | Curing aide etc. | Dielectric constant | Thermal sagging of pattern | Film thickness |
|---|---|---|---|---|---|---|---|---|
| Example 24 | Ia-2 (32) | Ib-7 (68) | 302 | 135 mJ/cm$^2$ | 18-crown-6-ether | 3.2 | 3 μm OK | 0.5 μm |
| Comparative Example 1 | Comparison 1 (40) | Ib-2 (60) | 399 | 85 mJ/cm$^2$ | none | 3.1 | 10 μm NG | 2.0 μm |
| Comparative Example 2 | Comparison 2 (75) | Ib-2 (25) | 362 | 180 mJ/cm$^2$ | none | 3.1 | 10 μm NG | 2.0 μm |
| Comparative Example 3 | Comparison 3 (70) | Ib-2 (30) | 356 | 190 mJ/cm$^2$ | none | 3.2 | 10 μm NG | 2.0 μm |
| Comparative Example 4 | Comparison 2 (40) | Ib-6 (60) | 225 | 140 mJ/cm$^2$ | none | 3.2 | 10 μm NG | 0.5 μm |
| Comparative Example 5 | Ia-1 (30) | Ib-3 (70) | 1,220 | 30 mJ/cm$^2$ | Acid | 3.1 | 10 μm NG ** | 2.0 μm |
| Comparative Example 6 | Ia-3 (90) | Ib-6 (10) | 2 | >500 mJ/cm$^2$ | Acid | — | No image was formed. | 2.0 μm |

** Residual layer thickness was less than 50%.

The invention claimed is:

1. A positive photosensitive siloxane composition comprising (I) two kinds or more of polysiloxanes which have different dissolution rates in a tetramethylammonium hydroxide aqueous solution each other, (II) a diazonaphthoquinone derivative, and (III) solvent,
wherein the polysiloxane (I) is a mixture of
a polysiloxane (Ia) which is obtained by hydrolyzing and condensing, in the presence of a basic catalyst, a silane compound represented by the formula (1):

and a silane compound represented by the formula (2):

in which R represents a linear, branched or cyclic alkyl group having 1 to 20 carbon atoms, in which any methylene group may be replaced by an oxygen atom, or represents an aryl group having 6 to 20 carbon atoms, in which any hydrogen atom may be replaced by a fluorine atom, and R$^1$ represents an alkyl group having 1 to 5 carbon atoms,
a prebaked film of which is soluble in a 5% tetramethylammonium hydroxide aqueous solution, and a dissolution rate of which is 1,000 Å/second or less in a 5% TMAH aqueous solution, and
a polysiloxane (Ib) which is obtained by hydrolyzing and condensing at least the silane compound represented by the formula (1) in the presence of an acidic or basic catalyst, and a prebaked film of which has a dissolution rate of 100 Å/second or more in a 2.38% tetramethylammonium hydroxide aqueous solution.

2. The positive photosensitive siloxane composition according to claim 1, wherein the polysiloxane (Ib) is obtained by further using a silane compound represented by the formula (2).

3. The positive photosensitive siloxane composition according to claim 1, wherein the dissolution rate of the polysiloxane (I) in a 2.38% TMAH aqueous solution is 10 Å/second to 1,000 Å/second.

4. The positive photosensitive siloxane composition according to claim 1, wherein the dissolution rate of a prebaked film of the polysiloxane (Ib) in a 2.38% TMAH aqueous solution is 4,000 Å/second or more and the dissolution rate of a prebaked film of the polysiloxane (I) in a 2.38% TMAH aqueous solution is 100 Å/second to 1,000 Å/second.

5. The positive photosensitive siloxane composition according to claim 1, wherein the amount of polysiloxane (Ia) in the polysiloxane (I) is 1 to 80 wt %.

6. The positive photosensitive siloxane composition according to claim 1, wherein the polysiloxane (Ib) is obtained by hydrolyzing and condensing the aforementioned silane compound or compounds in the presence of a basic catalyst.

7. The positive photosensitive siloxane composition according to claim 1, wherein the polysiloxane (Ia) contains the silane compound represented by the formula (2) in an amount of 1 mole-% to 40 mole-%.

8. The positive photosensitive siloxane composition according to claim 1, wherein the polysiloxane (Ib) contains the silane compound represented by the formula (2) in an amount of 1 mole-% to 40 mole-%.

9. The positive photosensitive siloxane composition according to claim 1, wherein the amount of a silane compound in which R is a methyl group is 20 mole-% to 80 mole-% in the silane compound (1).

10. The positive photosensitive siloxane composition according to claim 1, which contains a curing aid that can generate an acid or base by heat or radiation.

11. The positive photosensitive siloxane composition according to claim 1, which contains a crown ether.

12. A cured film which is formed by the positive photosensitive siloxane composition according to claim 1.

13. An element having the cured film according to claim 12.

14. The element according to claim 13, wherein a dielectric constant of the cured film is 4 or less.

* * * * *